(12) United States Patent
Ho et al.

(10) Patent No.: US 10,665,523 B2
(45) Date of Patent: May 26, 2020

(54) SEMICONDUCTOR SUBSTRATE, SEMICONDUCTOR PACKAGE, AND METHOD FOR FORMING THE SAME

(71) Applicant: Advanced Semiconductor Engineering, Inc., Kaohsiung (TW)

(72) Inventors: Cheng-Lin Ho, Kaohsiung (TW); Chih-Cheng Lee, Kaohsiung (TW)

(73) Assignee: ADVANCE SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/038,037

(22) Filed: Jul. 17, 2018

(65) Prior Publication Data

US 2020/0027810 A1  Jan. 23, 2020

(51) Int. Cl.
*H01L 23/00* (2006.01)
*H01L 23/367* (2006.01)
*H01L 21/768* (2006.01)
*H01L 23/373* (2006.01)

(52) U.S. Cl.
CPC ...... *H01L 23/367* (2013.01); *H01L 21/76816* (2013.01); *H01L 21/76874* (2013.01); *H01L 23/3736* (2013.01); *H01L 24/17* (2013.01)

(58) Field of Classification Search
CPC .............. H01L 23/367; H01L 23/3736; H01L 21/76874; H01L 21/76816; H01L 24/17
See application file for complete search history.

(56) References Cited

U.S. PATENT DOCUMENTS

| | | | | |
|---|---|---|---|---|
| 6,326,701 B1 * | 12/2001 | Shinogi | ............... | H01L 23/3114 257/620 |
| 7,829,981 B2 | 11/2010 | Hsu | | |
| 8,212,340 B2 | 7/2012 | Liao | | |
| 2006/0291029 A1 * | 12/2006 | Lin | ............... | H01L 21/2885 257/622 |
| 2011/0156253 A1 * | 6/2011 | Tsai | ............... | H01L 24/03 257/738 |
| 2016/0189980 A1 * | 6/2016 | Paek | ............... | H01L 23/49894 438/126 |
| 2016/0343882 A1 * | 11/2016 | Kuo | ............... | H01L 31/02002 |

* cited by examiner

*Primary Examiner* — Kyoung Lee
(74) *Attorney, Agent, or Firm* — Foley & Lardner LLP

(57) ABSTRACT

The present disclosure provides a semiconductor substrate, including a first patterned conductive layer, a dielectric structure on the first patterned conductive layer, wherein the dielectric structure having a side surface, a second patterned conductive layer on the dielectric structure and extending on the side surface, and a third patterned conductive layer on the second patterned conductive layer and extending on the side surface. The present disclosure provides a semiconductor package including the semiconductor substrate. A method for manufacturing the semiconductor substrate and the semiconductor package is also provided.

18 Claims, 25 Drawing Sheets

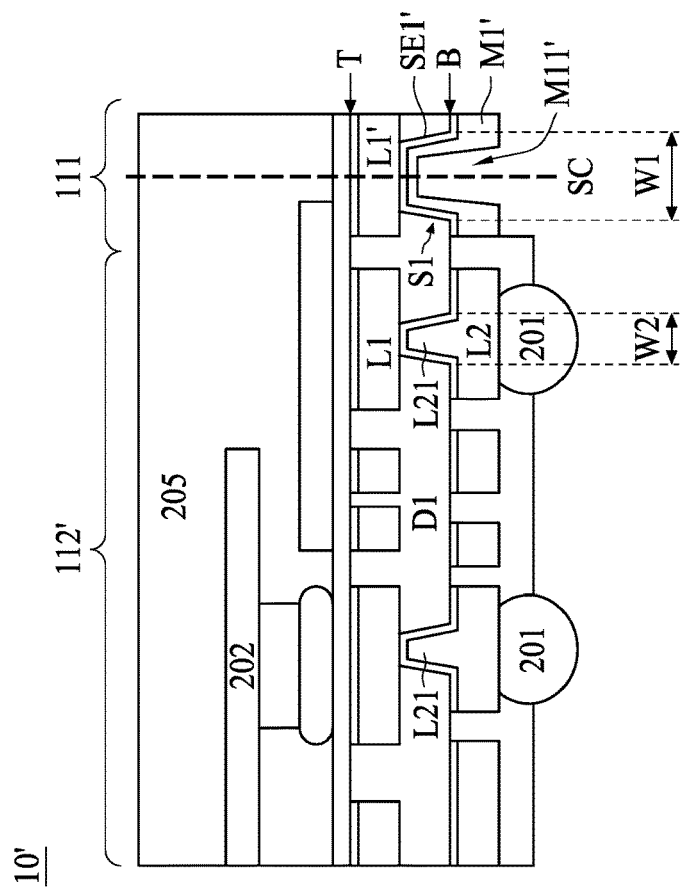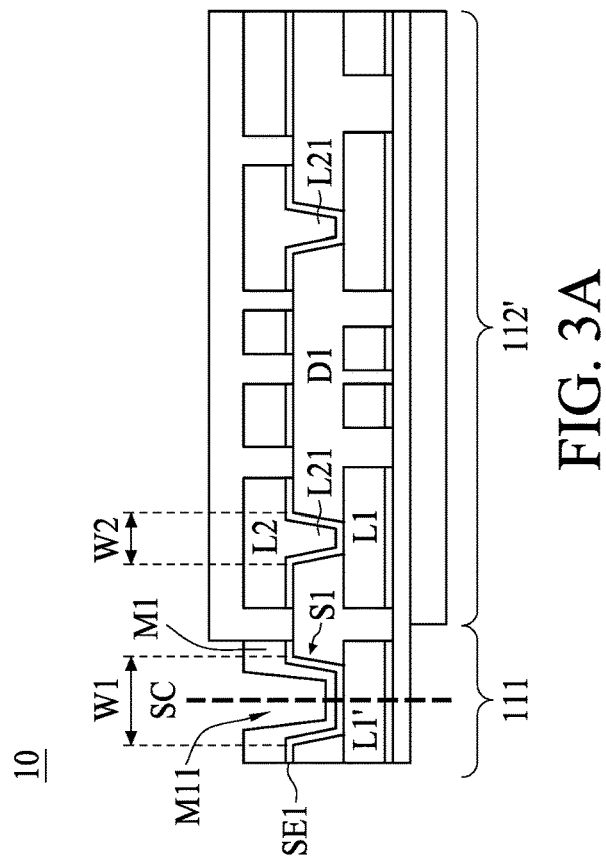
FIG. 3A
FIG. 3B

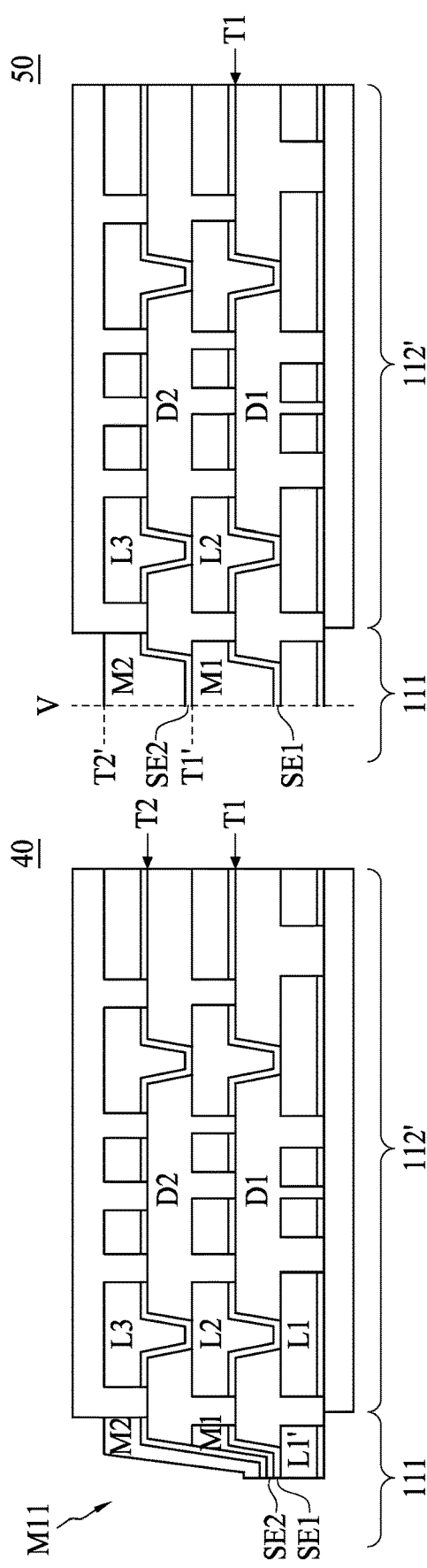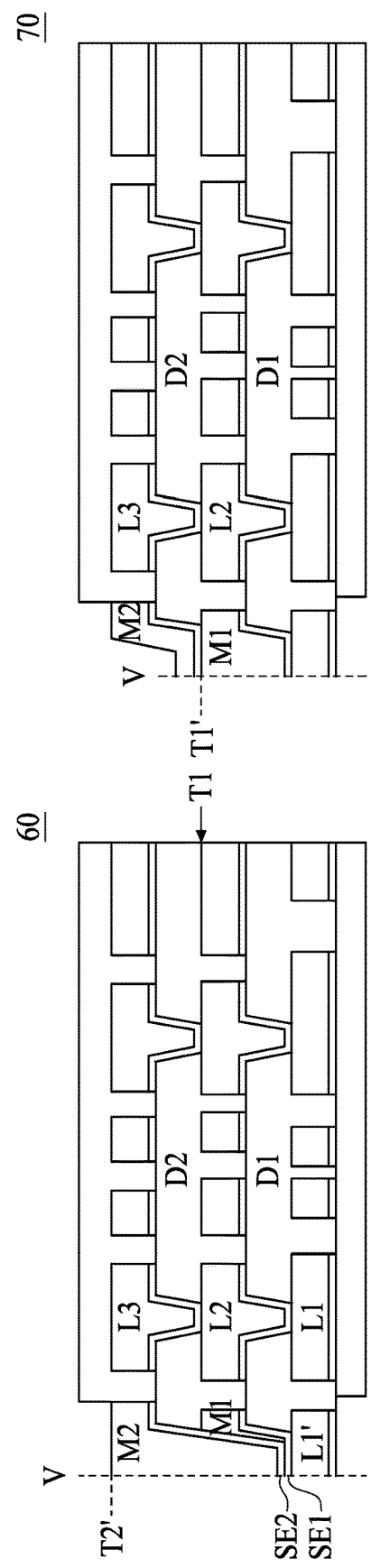

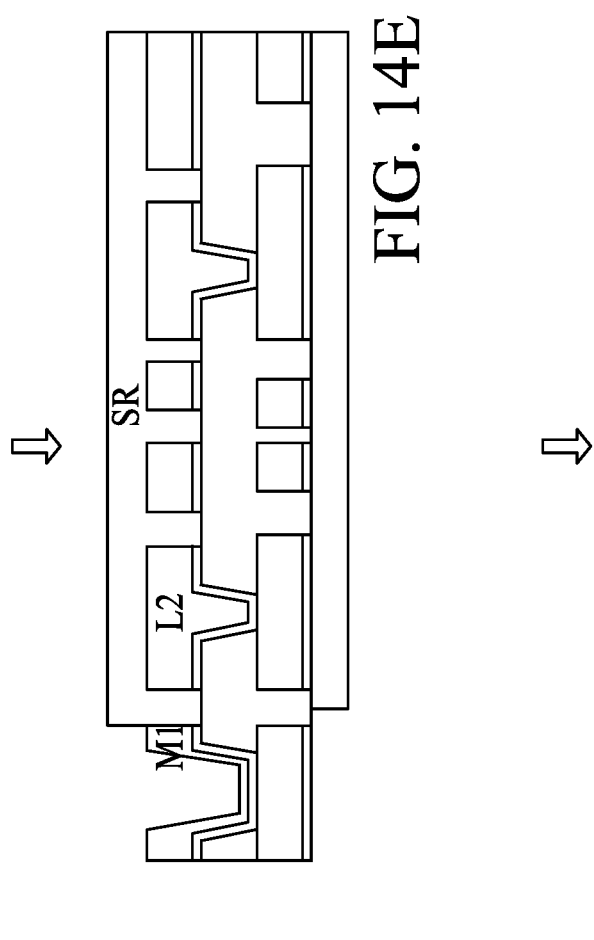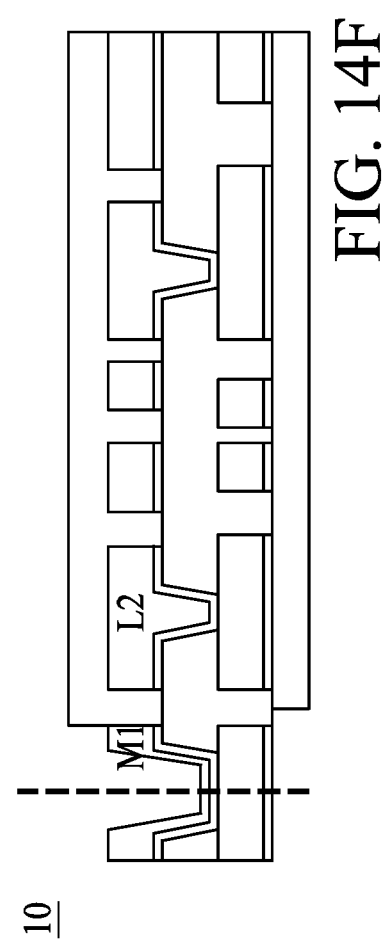

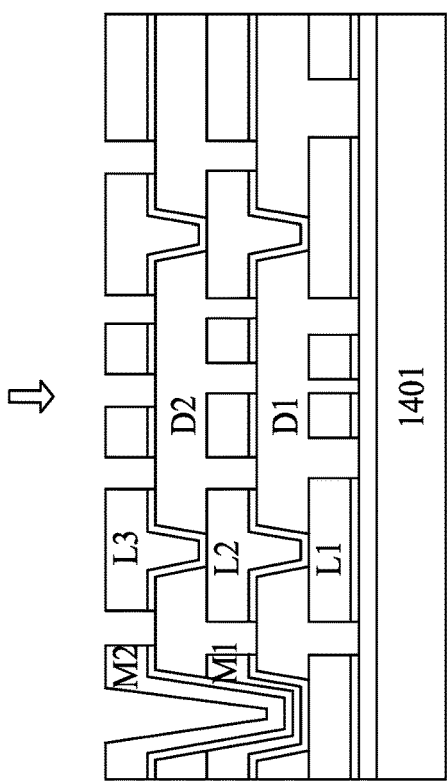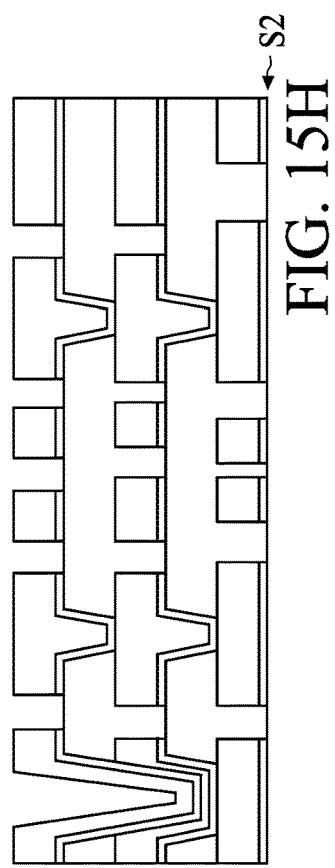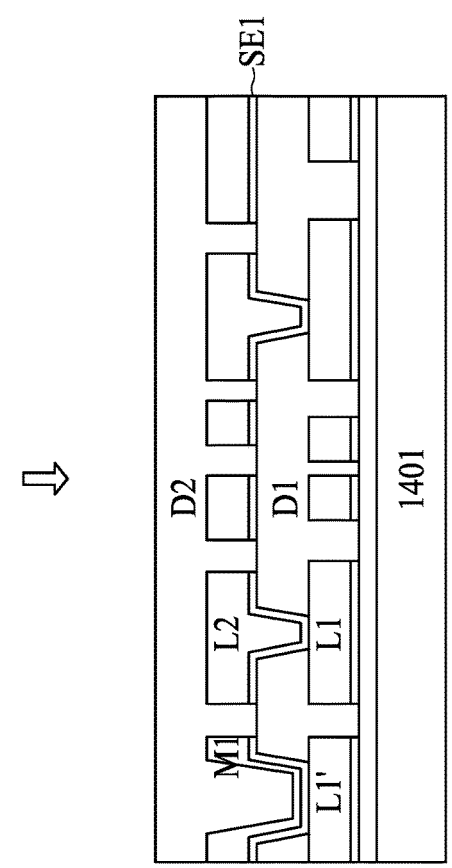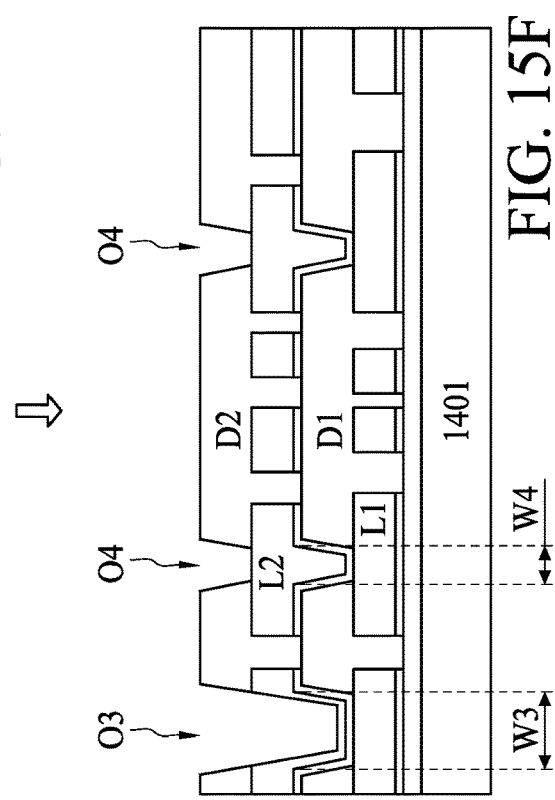
FIG. 15E
FIG. 15F
FIG. 15G
FIG. 15H

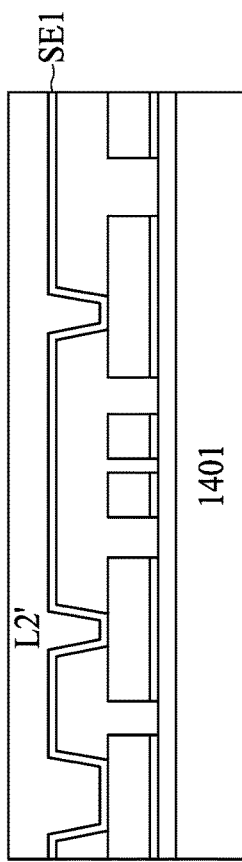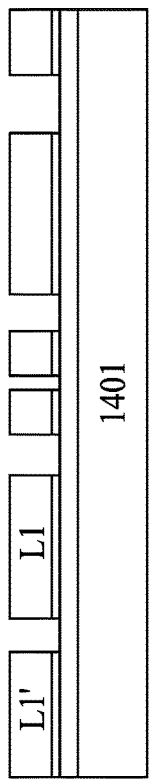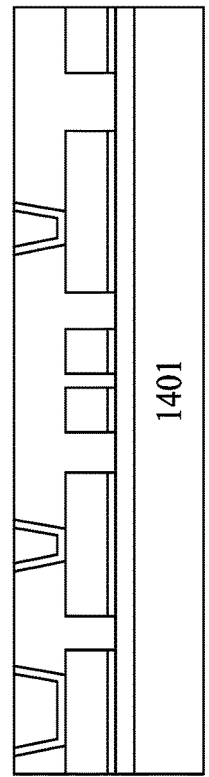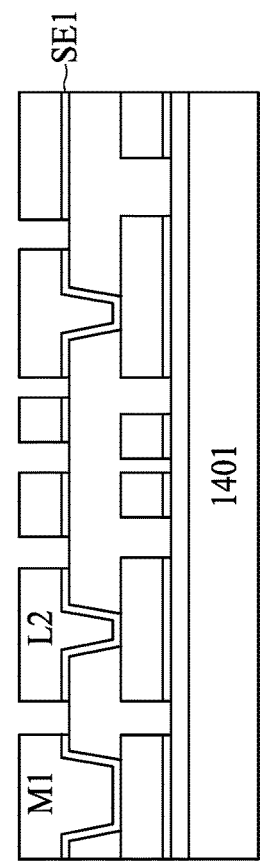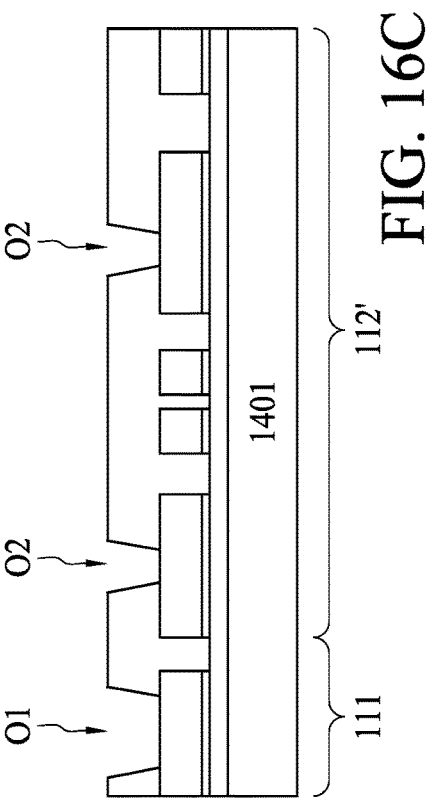
FIG. 16A  FIG. 16B  FIG. 16C  FIG. 16D  FIG. 16E  FIG. 16F

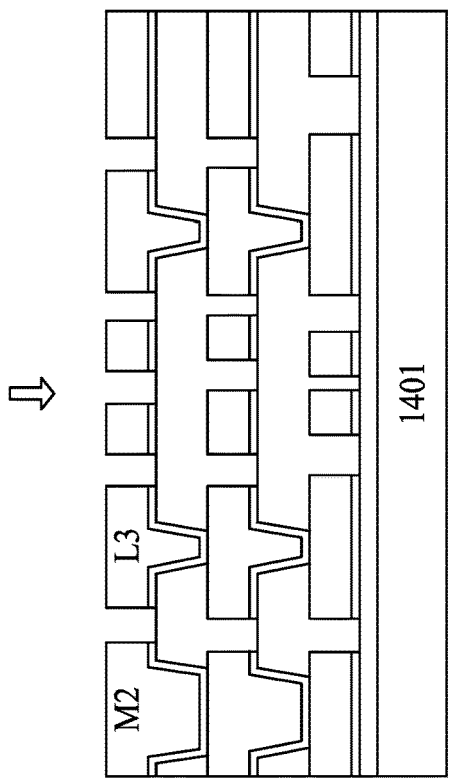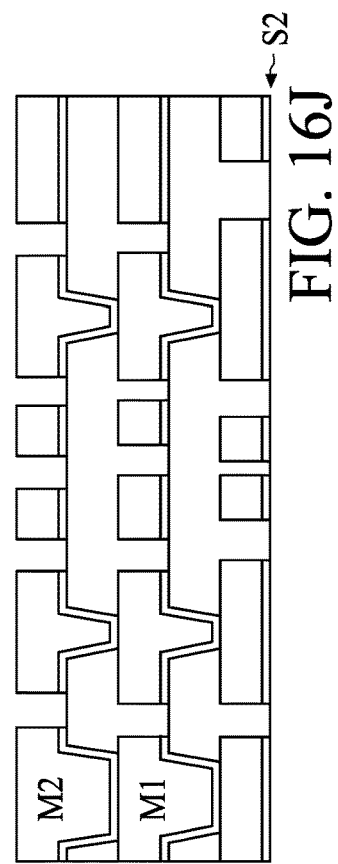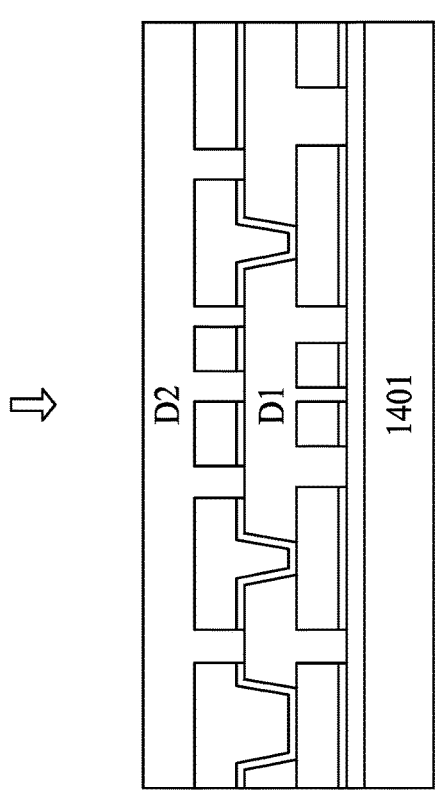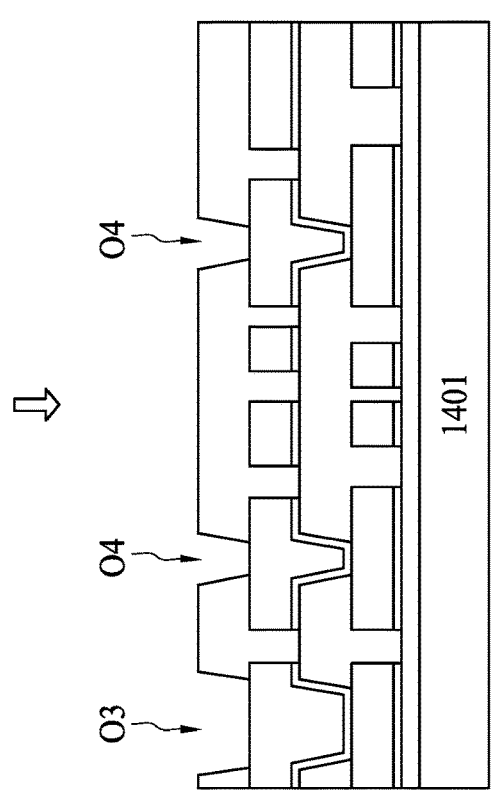

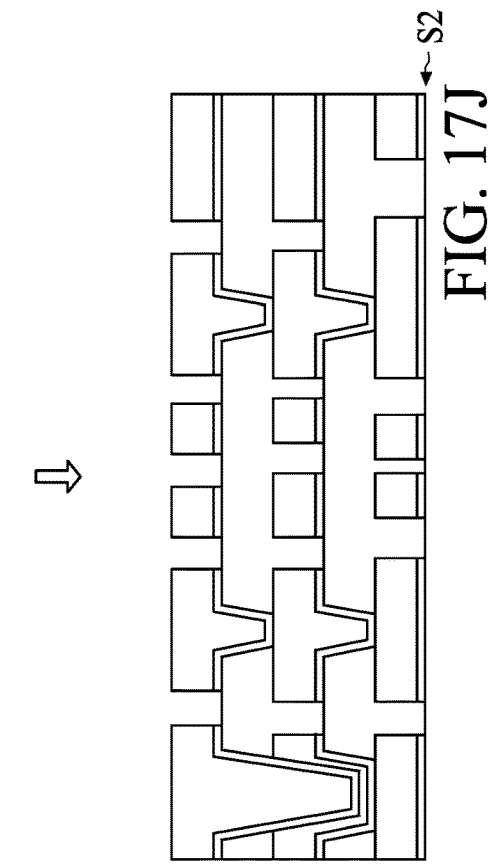
FIG. 17I
FIG. 17J
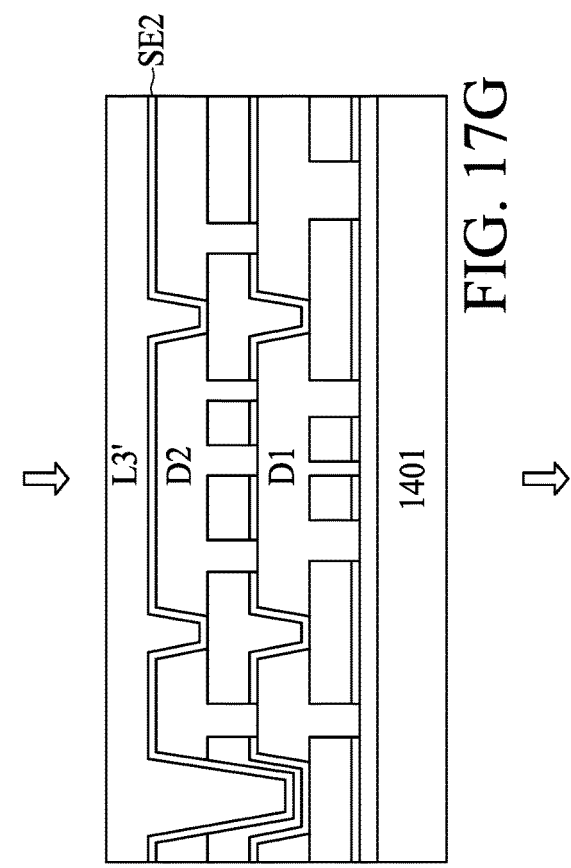
FIG. 17G
FIG. 17H

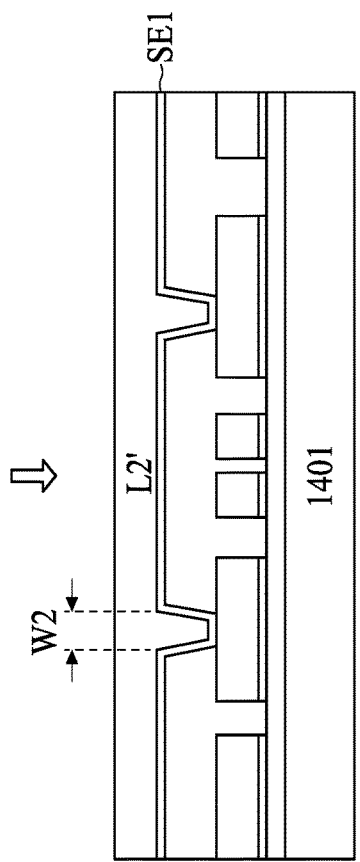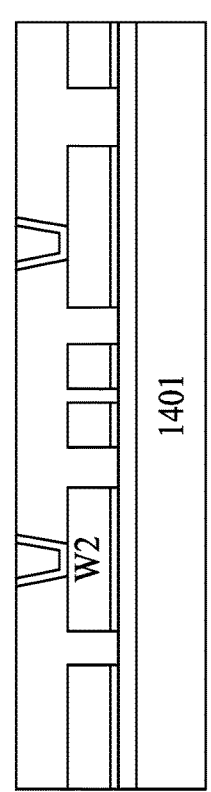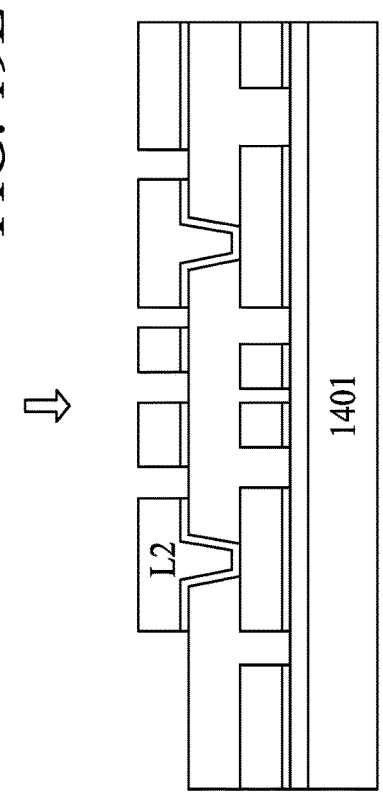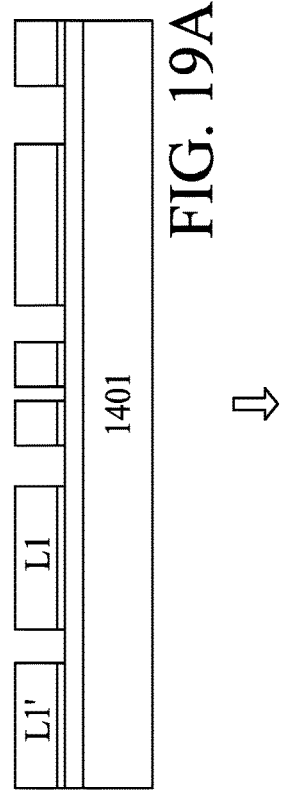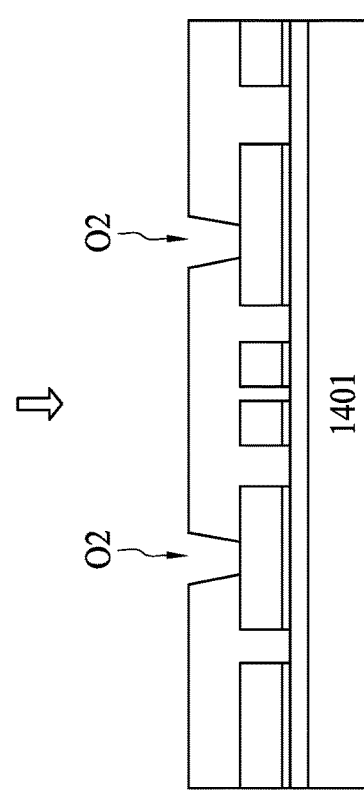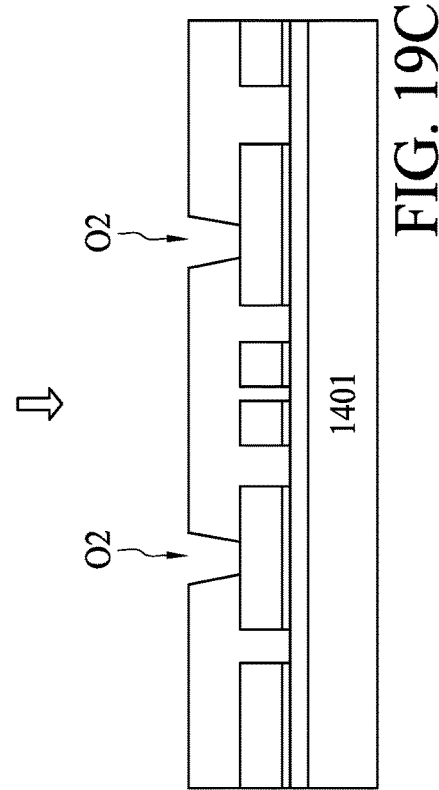

SEMICONDUCTOR SUBSTRATE, SEMICONDUCTOR PACKAGE, AND METHOD FOR FORMING THE SAME

BACKGROUND

Electronic packages, such as electronic control modules, generally contain fabricated electrical circuitry including electronic components such as transistors and resistors. The circuitry conducts electrical current which, in turn, generates thermal energy (heat) within the electronic package. Excessive heat build-up within certain electronic packages and other components within a module may lead to adverse effects including electrical circuit failure. Thus, it is desirable to dissipate heat away from the electronic package.

Many electronic packages employ semiconductor devices in the form of a flip chip. Some comparative techniques for dissipating thermal energy from the electronic package employ a thermally conductive heat sink supported in contact with the package via clamps, or directly mounted onto a printed circuit board.

While comparative approaches generally suffice to dissipate some of the thermal energy (heat) away from the semiconductor device, many approaches do not offer optimal heat dissipation. For example, many approaches achieve a substantial amount of heat dissipation in one general direction, primarily by placing a heat sink in thermal contact with one surface of the semiconductor device. While some additional heat dissipation may be achieved in other directions through air or some other medium exhibiting poor thermal conductivity, such heat dissipation is generally inadequate. The resultant heat dissipation realized in many comparative semiconductor packages results in size and power limitations.

Accordingly, it is therefore desirable to provide a semiconductor device and heat sink package and method of dissipating thermal energy (heat) away from the semiconductor device in an optimal manner.

SUMMARY

Some embodiments of the present disclosure provide a semiconductor substrate, including a first patterned conductive layer, a dielectric structure on the first patterned conductive layer, wherein the dielectric structure has a side surface, a second patterned conductive layer on the dielectric structure and extending on the side surface, and a third patterned conductive layer on the second patterned conductive layer and extending on the side surface.

Some embodiments of the present disclosure provide a semiconductor package, including a dielectric structure having a bottom surface configured to be proximal to a solder bump and a side surface connecting to the bottom surface, a first patterned conductive layer proximal to a top surface of the dielectric structure, the top surface being opposite to the bottom surface, a second patterned conductive layer extending on the side surface, a third patterned conductive layer closer to the bottom surface than the first patterned conductive layer and extending on the side surface; and a semiconductor die over the top surface.

Some embodiments of the present disclosure provide a method for manufacturing a semiconductor package, including providing a carrier, forming a first patterned conductive layer on the carrier, defining a scribe line region in the dielectric structure by forming an opening in the dielectric structure, and concurrently forming a second patterned conductive layer on the dielectric structure and extending into the opening.

BRIEF DESCRIPTION OF THE DRAWINGS

Aspects of the present disclosure are best understood from the following detailed description when read with the accompanying figures. It is noted that various features may not be drawn to scale. In fact, the dimensions of the various features may be arbitrarily increased or reduced for clarity of discussion.

FIG. 3A is a cross-sectional view illustrating a semiconductor substrate, according to some embodiments of the present disclosure.

FIG. 3B is a cross-sectional view illustrating a semiconductor package, according to some embodiments of the present disclosure.

FIG. 4, FIG. 5, FIG. 6, FIG. 7, and FIG. 8 are cross-sectional views illustrating various semiconductor substrates, according to some embodiments of the present disclosure.

FIG. 14A, FIG. 14B, FIG. 14C, FIG. 14D, FIG. 14E, and FIG. 14F are cross-sectional views illustrating a semiconductor substrate in various manufacturing stages, according to some embodiments of the present disclosure.

FIG. 15A, FIG. 15B, FIG. 15C, FIG. 15D, FIG. 15E, FIG. 15F, FIG. 15G, FIG. 15H, FIG. 15I, and FIG. 15J are cross-sectional views illustrating a semiconductor substrate in various manufacturing stages, according to some embodiments of the present disclosure.

FIG. 16A, FIG. 16B, FIG. 16C, FIG. 16D, FIG. 16E, FIG. 16F, FIG. 16G, FIG. 16H, FIG. 16I, FIG. 16J, FIG. 16K, and FIG. 16L are cross-sectional views illustrating a semiconductor substrate in various manufacturing stages, according to some embodiments of the present disclosure.

FIG. 17A, FIG. 17B, FIG. 17C, FIG. 17D, FIG. 17E, FIG. 17F, FIG. 17G, FIG. 17H, FIG. 17I, FIG. 17J, FIG. 17K, and FIG. 17L are cross-sectional views illustrating a semiconductor substrate in various manufacturing stages, according to some embodiments of the present disclosure.

FIG. 19A, FIG. 19B, FIG. 19C, FIG. 19D, FIG. 19E, FIG. 19F, FIG. 19G, FIG. 19H, FIG. 19I, FIG. 19J, FIG. 19K, and FIG. 19L are cross-sectional views illustrating a semiconductor substrate in various manufacturing stages, according to some embodiments of the present disclosure.

DETAILED DESCRIPTION

Figure 1A:
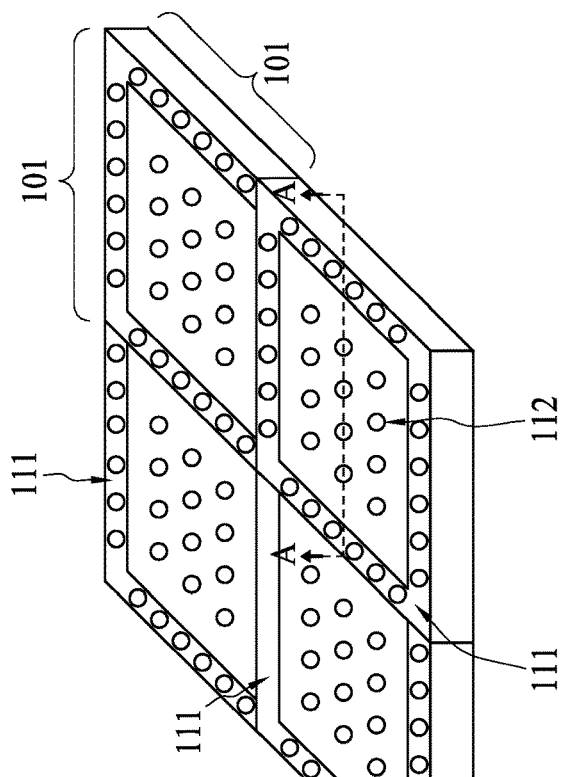
FIG. 1A and FIG. 1B are perspective views of a portion of a semiconductor substrate, according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. In the present disclosure, reference to the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

Further, spatially relative terms, such as "beneath," "below," "lower," "above," "upper," "lower," "left," "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It will be understood that when an element is referred to as being "connected to" or "coupled to" another element, it may be directly connected to or coupled to the other element, or intervening elements may be present.

The numerical ranges and parameters setting forth the broad scope of the disclosure are approximations, and the numerical values set forth in the specific examples may be reported as precisely as possible. Some numerical values, however, may contain certain errors resulting from the standard deviation found in the respective testing measurements. Also, as used herein, the term "about" generally means within ±10%, ±5%, ±1%, or ±0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise. The term "substantially coplanar" can refer to two surfaces within micrometers (µm) of lying along a same plane, such as within 10 µm, within 5 µm, within 1 µm, or within 0.5 µm of lying along the same plane. When referring to numerical values or characteristics as "substantially" the same, the term can refer to the values lying within ±10%, ±5%, ±1%, or ±0.5% of an average of the values.

Some packages possess greater requirements of heat dissipation. In some embodiments, attaching an extra heat sink over molding compound, removing a portion of the molding compound in order to expose the chip being packaged, or adopting new molding compound materials having better heat conductance have been utilized to meet the demand from a packaging level. Nevertheless, the aforesaid measures increase the cost to overall package production.

On the other hand, increasing copper density, for example, thickening copper lines or plating extra copper in the substrate, may also meet the demand from a substrate level. However, thickness of the substrate, and hence thickness of the entire package, may be increased as a result.

The present disclosure further provides substrate units surrounded by scribe lines. By plating copper into trenches positioned on the scribe lines concurrently with plating copper to form conductive wirings in the substrate, copper density in substrate can be effectively increased. Such operation enhances heat dissipation through greater copper density without additional manufacturing operations. Due to the fact that the width of the scribe line trench is greater than the width of the conductive wiring trench, it is anticipated that the conductive wiring trench is filled before the scribe line trench. Such unfilled scribe line trench may further alleviate substrate warpage.

Figure 1B:
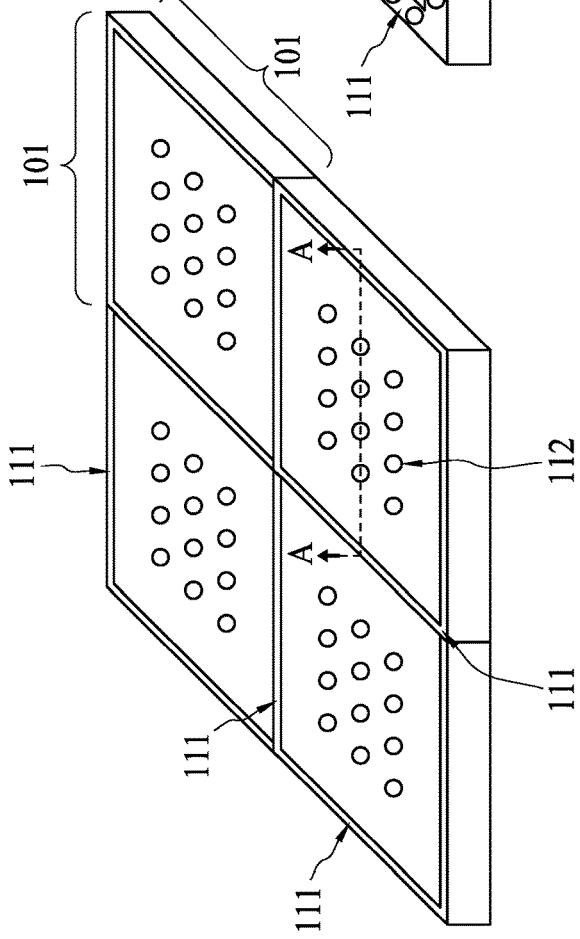

Referring to FIG. 1A and FIG. 1B, FIG. 1A and FIG. 1B are perspective views of a portion of a semiconductor substrate, according to some embodiments of the present disclosure. The semiconductor substrate is composed of a plurality of units 101 defined by corresponding scribe line regions 111. As shown in FIG. 1A, each of the units 101 is surrounded at four sides by the scribe line regions 111, thus defining a tetragonal shape unit 101. In some embodiments, the scribe line regions 111 are in a form of filled or partially-filled continuous trenches. Alternatively, the scribe line regions 111 can be formed of filled or partially-filled vias, such as those shown in FIG. 1B.

Figure 1C:
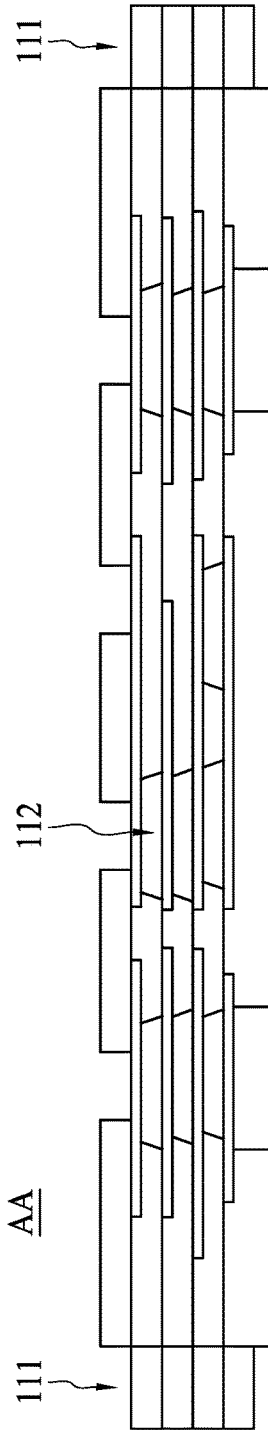
FIG. 1C is a cross-sectional view along a dissection line AA labeled in FIG. 1A and FIG. 1B.

In reference to FIG. 1C, FIG. 1C is a cross-sectional view dissected from line AA in FIG. 1A and FIG. 1B. Line AA dissects one unit on the substrate from its left boundary to its right boundary. Starting from the left boundary and traversing to the right, scribe line regions 111 are first seen on the left, followed by a plurality of conductive layers 112 within the unit, and finally the other scribe line regions 111 are seen at the right boundary. In some embodiments, the conductive layers 112 may function as power lines and re-distribution lines (RDL). The plurality of conductive layers 112 are formed in a layer-based dielectric structure, that is, each conductive layer is formed in a corresponding dielectric layer, and manufacturing traces such as a seed layer disposed prior to conductive layer plating can be identified under a microscope with or without slight etching. Similarly, such manufacturing traces can also be found in the scribe line regions 111. Details of such manufacturing traces are described in FIG. 3A and FIG. 3B of the present disclosure.

Figure 2A:
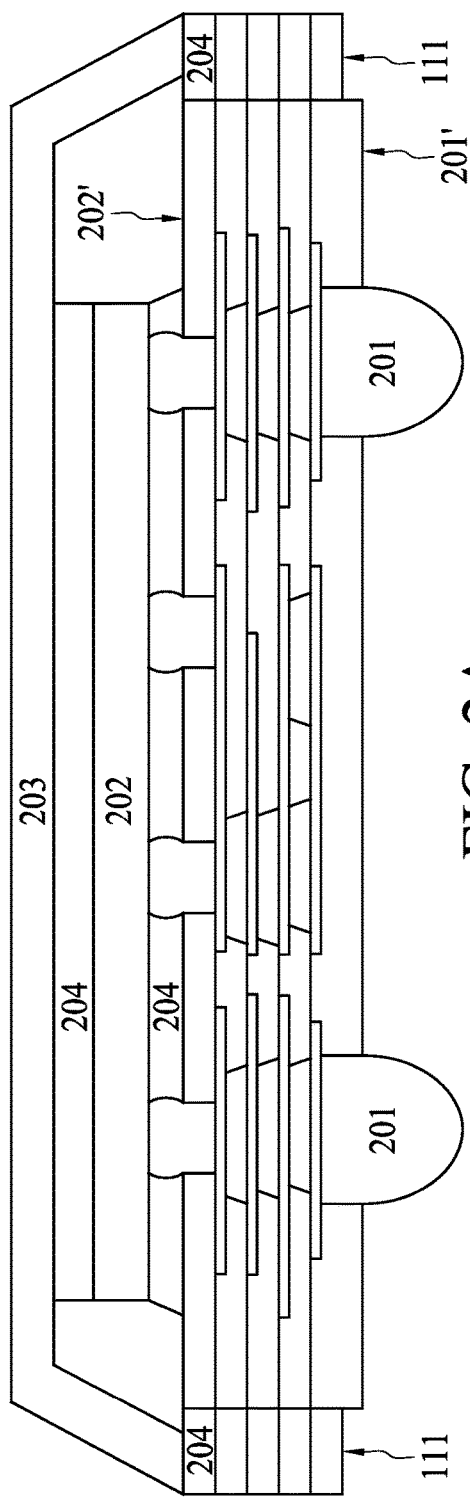
FIG. 2A, FIG. 2B, and FIG. 2C are cross-sectional views illustrating a semiconductor package, according to some embodiments of the present disclosure.
Figure 2B:
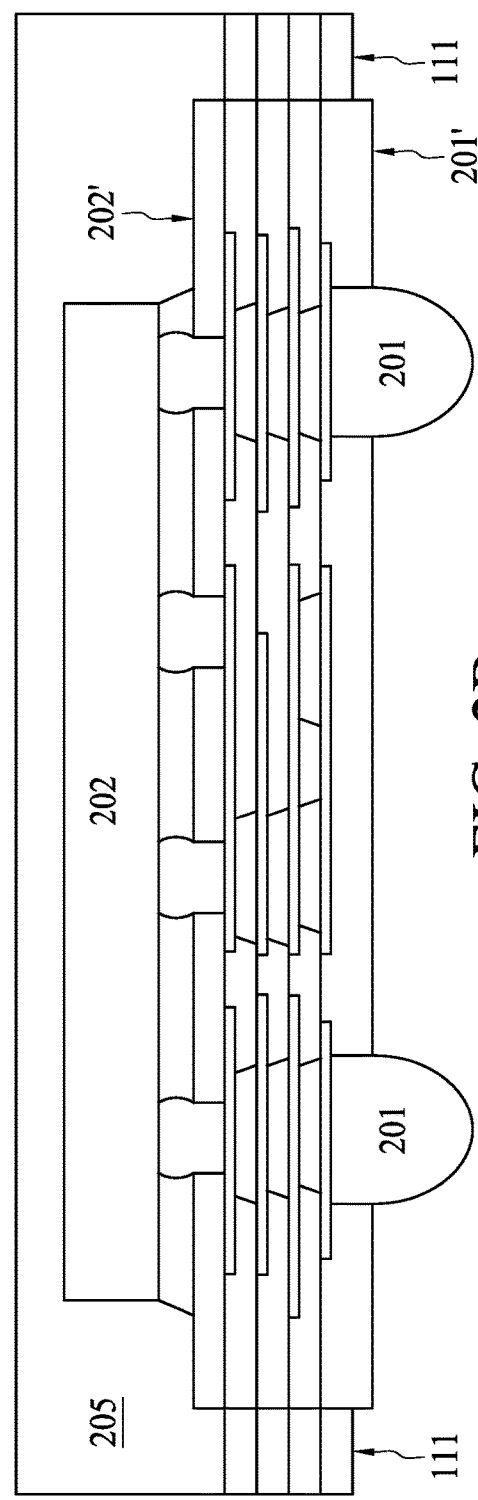
Figure 2C:
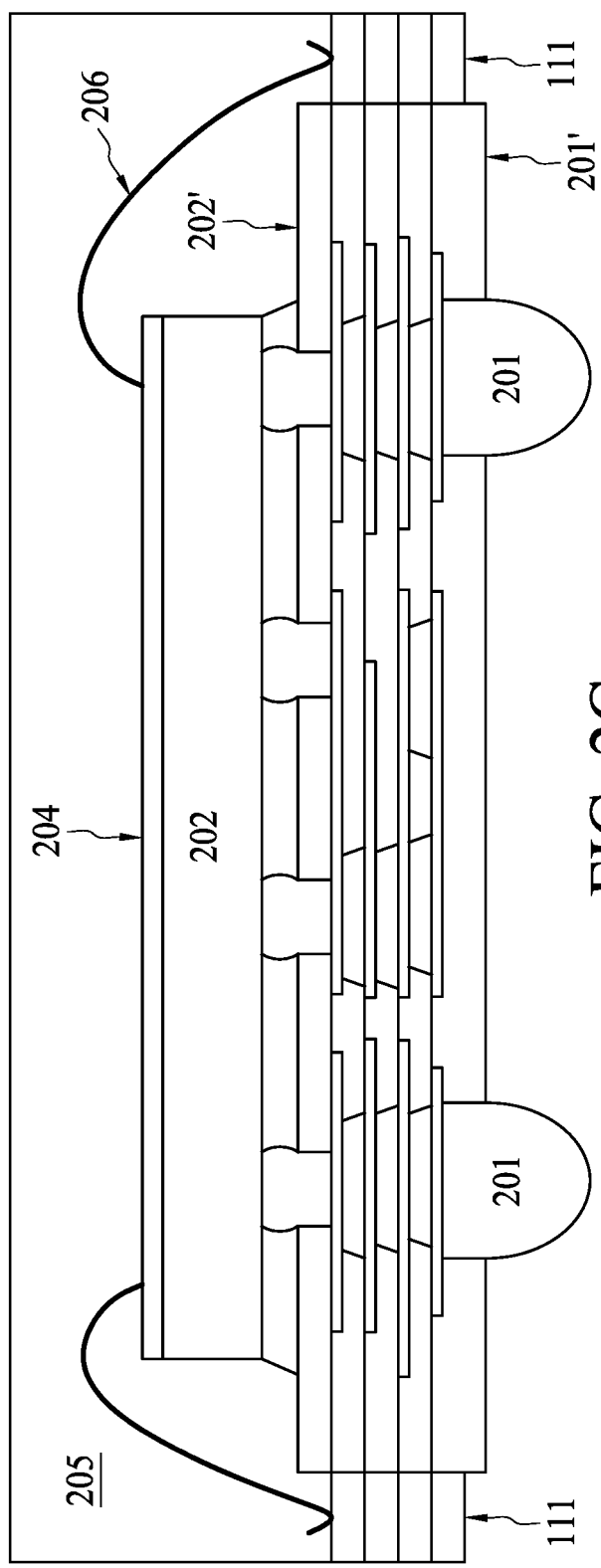
Figure 9:
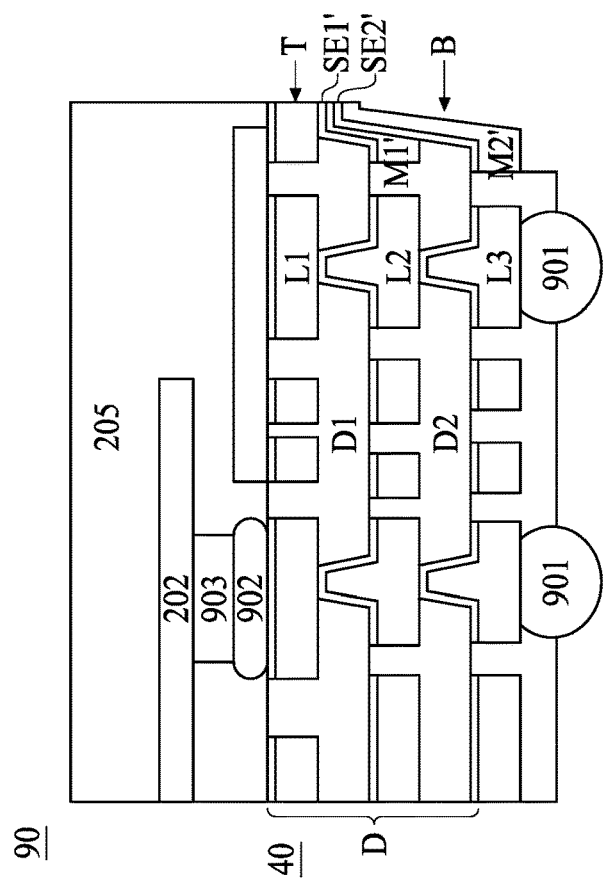
FIG. 9, FIG. 10, FIG. 11, FIG. 12, and FIG. 13 are cross-sectional views illustrating various semiconductor packages, according to some embodiments of the present disclosure.

Referring to FIG. 2A, FIG. 2B, and FIG. 2C, FIG. 2A, FIG. 2B, and FIG. 2C are cross-sectional views illustrating three different semiconductor packages, according to some embodiments of the present disclosure. In FIG. 2A, a semiconductor substrate shown in FIG. 1C is integrated with solder bumps 201 at a bump side 201' and a semiconductor die 202 at a die side 202' to form a semiconductor package 20A. In some embodiments, the die 202 is joined with the substrate through conductive bumps and thermal interface materials (TIM) 204. Alternatively, the TIM 204 can be applied in proximity to the die side 202' of the substrate over the scribe line regions 111, and a heat sink 203 is joined with the substrate via the TIM 204 over the scribe line regions 111. The semiconductor package 20A provides better heat dissipation than comparative semiconductor packages because at least the scribe line regions 111 possess higher density conductive materials, such as copper, so that the heat generated at the die 202 can be effectively dissipated through a more effective heat-conducting channel from the heat sink 203 to the conductive materials at the scribe line regions 111.

In FIG. 2B, a semiconductor substrate shown in FIG. 1C is integrated with solder bumps 201 at a bump side 201' and a semiconductor die 202 at a die side 202' to form a semiconductor package 20B. In some embodiments, the die 202 is joined with the substrate through conductive bumps and underfill materials. Alternatively, a molding compound 205 with suitable heat conductance covers the die 202 and concurrently contacts the conductive materials at the scribe line regions 111. The semiconductor package 20B provides better heat dissipation than comparative semiconductor packages because at least the scribe line regions 111 possess higher density conductive materials, such as copper, so that the heat generated at the die 202 can be effectively dissipated through a more effective heat-conducting channel from the molding compound 205 to the conductive materials at the scribe line regions 111.

In FIG. 2C, a semiconductor substrate shown in FIG. 1C is integrated with solder bumps 201 at a bump side 201' and a semiconductor die 202 at a die side 202' to form a semiconductor package 20B. In some embodiments, the die 202 is joined with the substrate through conductive bumps and/or underfill materials. Alternatively, a molding compound 205 with suitable heat conductance covers the die 202 and concurrently contacts the conductive materials at the scribe line regions 111. Furthermore, a copper wire 206 further connects a conductive surface 204, for example, at a back side of the die 202, to the conductive materials at the scribe line regions 111. The semiconductor package 20C provides better heat dissipation than comparative semiconductor packages because at least the scribe line regions 111 possess higher density conductive materials, such as copper, so that the heat generated at the die 202 can be effectively dissipated through a more effective heat-conducting channel from the molding compound 205 and the copper wire 206 to the conductive materials at the scribe line regions 111.

Referring to FIG. 3A, FIG. 3A is a cross-sectional view illustrating a semiconductor substrate 10, according to some embodiments of the present disclosure. The semiconductor substrate 10 includes a first patterned conductive layer L1 and a first dielectric structure D1 on the first patterned conductive layer L1. In some embodiments, the first patterned conductive layer L1 extends over a within unit region 112' and the first patterned conductive layer L1' extends over a scribe line region 111. The within unit region 112' is referred to herein as a conductive pattern region. Referring back to FIG. 1C, the first dielectric structure D1 possesses a side surface S1 over the scribe line region 111, rather than over the within unit region 112', of the substrate 10. The first dielectric structure D1 includes a plurality of via trenches L21 in the within unit region 112', wherein the plurality of via trenches L21 are filled with conductive materials and connect to a portion of the first patterned conductive layer L1. The first dielectric structure D1 includes at least a scribe line trench M11, in the scribe line region 111, wherein the scribe line trench M11 is filled or partially filled with conductive materials and connects to the first patterned conductive layer L1' of the scribe line region 111. The scribe line trench M11 is about 3 to 6 times wider than the via trench L21. In some embodiments, a width W2 of a via trench L21 is from about 50 to 70 µm, and a width W1 of a scribe line trench M11 is from about 250 to 300 µm. A scribe line SC in FIG. 3A illustrates a cutting edge of the substrate 10 after the die mount, molding encapsulation, and soldering are conducted and a semiconductor package is completed. After each unit is separated along the scribe line SC to form individual packages, the side surface S1 of the first dielectric structure D1 is a slanted surface at the edge of the individual package.

As shown in FIG. 3A, the conductive materials filled in the via trenches L21 and the scribe line trench M11 include a second patterned conductive layer SE1, a third patterned conductive layer L2, and a metal structure M1. In some other embodiments where several metal structures are presented, the metal structure M1 can be a first metal structure. In some embodiments, the third patterned conductive layer L2 and the metal structure M1 are formed in a single deposition operation. The third patterned conductive layer L2 and the metal structure M1 penetrate the first dielectric structure D1 and contact the first patterned conductive layer L1 and first patterned conductive layer L1', respectively. In some embodiments, the first patterned conductive layer L1' is electrically coupled with the first patterned conductive layer L1. In some embodiments, the first patterned conductive layer L1' is electrically coupled with the third patterned conductive layer L2 through the metal structure M1. In some embodiments, the conductive layer and the metal structure at the scribe line region 111 may or may not electrically connect to the conductive layer at the within unit region 112'.

The second patterned conductive layer SE1 may be a copper seed layer. The copper seed layer may be formed of copper or of one of copper alloys that include silver, chromium, nickel, tin, gold, and combinations thereof. The thickness of the copper seed layer is in a range between about 2000 and about 8000 Angstrom. The third patterned conductive layer L2 and the metal structure M1 can be composed of the same materials as the first patterned conductive layer L1. Since the scribe line trench M11 is wider than the via trench L21, the conductive materials may completely fill the via trench L21 but partially fill the scribe line trench M11. The extent of how much the scribe line trench M11 is filled can be determined by the relative widths of the via trench L21 and the scribe line trench M11. As previously discussed in FIG. 1A and FIG. 1B, the scribe line region 111 may include filled or partially-filled continuous trenches or filled or partially-filled vias; therefore, the scribe line trench M11 in other embodiments represents a scribe line via.

Referring to FIG. 3B, FIG. 3B is a cross-sectional view illustrating a semiconductor package 10', according to some embodiments of the present disclosure. The semiconductor package 10' includes a first dielectric structure D1 having a top surface T proximal to a semiconductor die 202 and a bottom surface B proximal to a solder bump 201. The package 10' includes a first patterned conductive layer L1 close to the top surface T. In some embodiments, the first patterned conductive layer L1 extends over a within unit region 112' and the first patterned conductive layer L1' extends over a scribe line region 111. Referring back to FIG. 1C, the first dielectric structure D1 possesses a side surface S1' over the scribe line region 111, rather than over the within unit region 112', of the package 10'. The first dielectric structure D1 includes a plurality of via trenches L21, in the within unit region 112', filled with conductive materials and connecting to a portion of the first patterned conductive layer L1. The first dielectric structure D1 includes at least a scribe line trench M11', in the scribe line region 111, filled or partially filled with conductive materials, connecting to the first patterned conductive layer L1' of the scribe line region 111. The scribe line trench M11 is about 3 to 6 times wider than the via trench L21. In some embodiments, a width W2 of a via trench L21 is from about 50 to 70 µm, and a width W1 of a scribe line trench M11' is from about 250 to 300 µm. A scribe line SC in FIG. 3B illustrates a cutting edge of the package 10'. After each unit is separated along the scribe line SC to form individual packages, the side surface S1 of the first dielectric structure D1 is a slanted surface at the edge of the individual package.

As shown in FIG. 3B, the conductive materials filled in the via trenches L21 and the scribe line trench M11' include a second patterned conductive layer SE1', a third patterned conductive layer L2, and a metal structure M1'. In some embodiments, the third patterned conductive layer L2 and the metal structure M1' are formed in a single deposition operation. The third patterned conductive layer L2 and the metal structure M1' penetrate the first dielectric structure D1 and contact the first patterned conductive layer L1 and first patterned conductive layer L1', respectively. In some embodiments, the first patterned conductive layer L1' is electrically coupled with the first patterned conductive layer L1. In some embodiments, the first patterned conductive layer L1' is electrically coupled with the third patterned conductive layer L2 through the metal structure M1'. In some embodiments, the conductive layer and the metal structure at the scribe line region 111 may or may not electrically connect to the conductive layer at the within unit region 112'.

The second patterned conductive layer SE1' may be a copper seed layer. The copper seed layer may be formed of copper or of one of copper alloys that include silver, chromium, nickel, tin, gold, and combinations thereof. The thickness of the copper seed layer is in a range between about 2000 and about 8000 Angstrom. The third patterned conductive layer L2 and the metal structure M1' can be composed of the same materials as the first patterned conductive layer L1. Since the scribe line trench M11' is wider than the via trench L21, the conductive materials may completely fill the via trench L21 but partially fill the scribe line trench M11'. The extent to which the scribe line trench M11' is filled can be determined by the relative widths of the via trench L21 and the scribe line trench M11'. As previously discussed in descriptions of FIG. 1A and FIG. 1B, the scribe line region 111 may include filled or partially-filled continuous trenches or filled or partially-filled vias; therefore, the scribe line trench M11 in other embodiments represents a scribe line via.

In FIG. 3B, the semiconductor die 202 is disposed over the top surface T of the first dielectric structure D1, joining with a bump over the top surface T of the first dielectric structure D1. The semiconductor die 202 is further encapsulated by a molding compound 205 disposed on the top surface T.

FIG. 4 to FIG. 8 are cross-sectional views illustrating various semiconductor substrates, according to some embodiments of the present disclosure. FIG. 4 illustrates a semiconductor substrate 40 based on the semiconductor structure 10 of FIG. 3A. Identical numeric labels in FIG. 4 can be interpreted as substantially identical elements or equivalents of those in FIG. 3A, and descriptions thereof are omitted for brevity. In addition to the first patterned conductive layer L1, L1', the second patterned conductive layer SE1, the first dielectric layer D1, the first metal structure M1, and the third patterned conductive layer L2, the semiconductor substrate 40 further includes a second dielectric layer D2 covering a portion of the first metal structure M1 and the third patterned conductive layer L2, a fourth patterned conductive layer SE2 extending on the side surface of the first and second dielectric layer D1, D2, a fifth patterned conductive layer L3, and a second metal structure M2 extending on the side surface of the first and second dielectric layers D1 and D2. In some embodiments, the second metal structure M2 may be composed of the same material as that comprising the first metal structure M1. In some embodiments, the fourth patterned conductive layer SE2 may be composed of the same material as that comprising the second patterned conductive layer SE1. In some embodiments, the fifth patterned conductive layer L3 may be composed of the same material as that comprising the third patterned conductive layer L2.

Similar to the connection between the first metal structure M1 and the third patterned conductive layer L2, the second metal structure M2 at the scribe line region 111 may or may not electrically connect to the conductive layers at the within unit region 112'.

In the semiconductor structure 40, the second metal structure M2 extends from a top surface T2 of the second dielectric layer D2 toward the side surface of the second dielectric layer D2, and overlaps with the portion of the first metal structure M1 extending over the side surface of the first dielectric layer D1 down to the bottom of the scribe line trench M11. Alternatively stated, the second metal structure M2 extends toward a level lower than the top surface T1 of the first dielectric layer D1. After suitable fine polishing and micro-etching, the fourth patterned conductive layer SE2 can be easily observed to be positioned between the first metal structure M1 and the second metal structure M2, as well as between the second metal structure M2 and the second dielectric layer D2.

Referring to FIG. 5, FIG. 5 illustrates a semiconductor substrate 50 similar to that of the semiconductor substrate 40, except for the portion of the first metal structure M1 and the second metal structure M2. In FIG. 5, the first metal structure M1 possesses a top surface T1' level with the top surface of the third patterned conductive layer L2. Similarly, the second metal structure M2 possesses a top surface T2' level with the top surface of the fifth patterned conductive layer L3. Note the first metal structure M1 and the second metal structure M2 fill the scribe line region 111 to an extent that a vertical sidewall V can be observed after die separation. A portion of the vertical sidewall V is a cutting edge of the second metal structure M2, and a portion of the vertical sidewall V is a cutting edge of the first metal structure M1. The fourth patterned conductive layer SE2 is positioned on the top surface T1', the side surface and the top surface of the second dielectric layer D2, separating the second metal structure M2 from the first metal structure M1 and the second dielectric layer D2.

Referring to FIG. 6, FIG. 6 illustrates a semiconductor substrate 60 similar to that of the semiconductor substrate 40, except for the portion of the first metal structure M1 and the second metal structure M2. In FIG. 6, the second metal structure M2 possesses a top surface T2' level with the top surface of the fifth patterned conductive layer L3. Note the second metal structure M2 fills the scribe line region 111 to an extent that a vertical sidewall V can be observed after die separation. The vertical sidewall V is a cutting edge of the second metal structure M2. The first metal structure M1 delineates the side surface of the first dielectric layer D1 and is positioned on the first patterned conductive layer L1'. The fourth patterned conductive layer SE2 is positioned on a side surface and the top surface of the second dielectric layer D2, separating the second metal structure M2 from the first metal structure M1 and the second dielectric layer D2. The second metal structure M2 also extends below the top surface T1 of the first dielectric layer D1.

Referring to FIG. 7, FIG. 7 illustrates a semiconductor substrate 70 similar to that of the semiconductor substrate 40, except for the portion of the first metal structure M1 and the second metal structure M2. In FIG. 7, the first metal structure M1 possesses a top surface T1' level with the top surface of the third patterned conductive layer L2. Note the first metal structure M1 fills the scribe line region 111 to an extent that a vertical sidewall V can be observed after die separation. The vertical sidewall V is a cutting edge of the first metal structure M1. The second metal structure M2 delineates the side surface of the second dielectric layer D2 and is positioned on the top surface T1' of the first metal structure M1.

Figure 8:
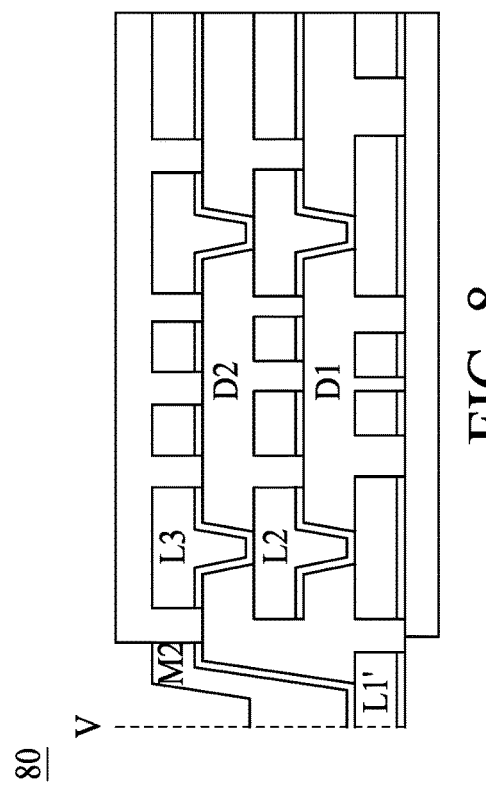
Figure 11:
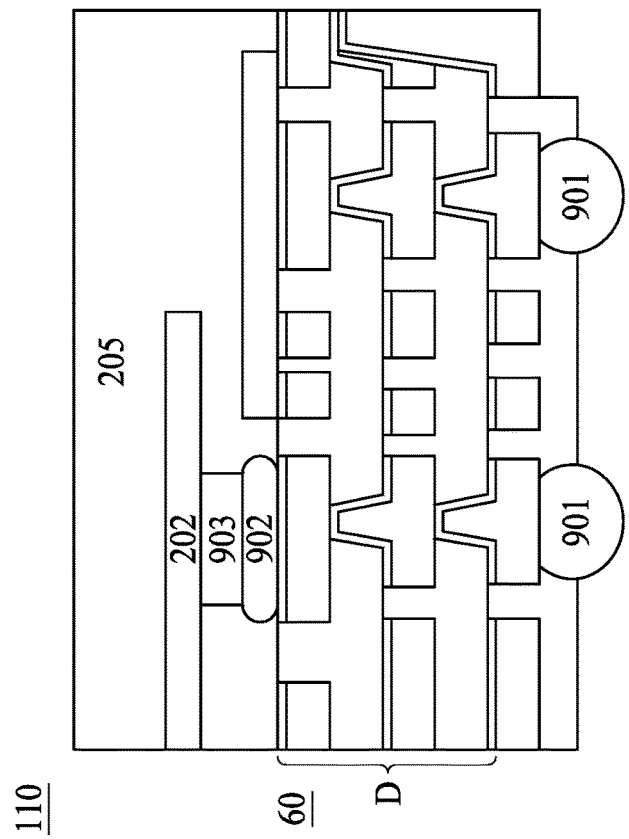
Figure 10:
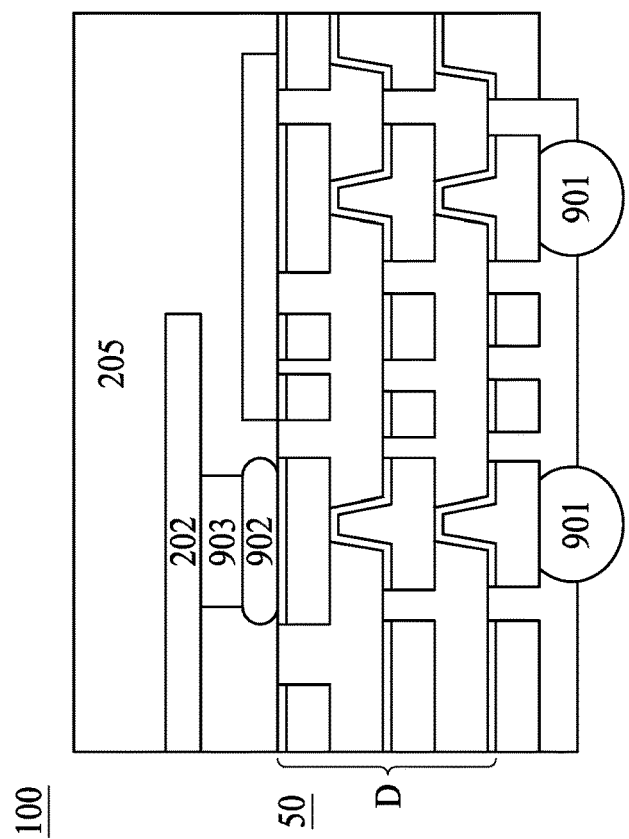
Figure 13:
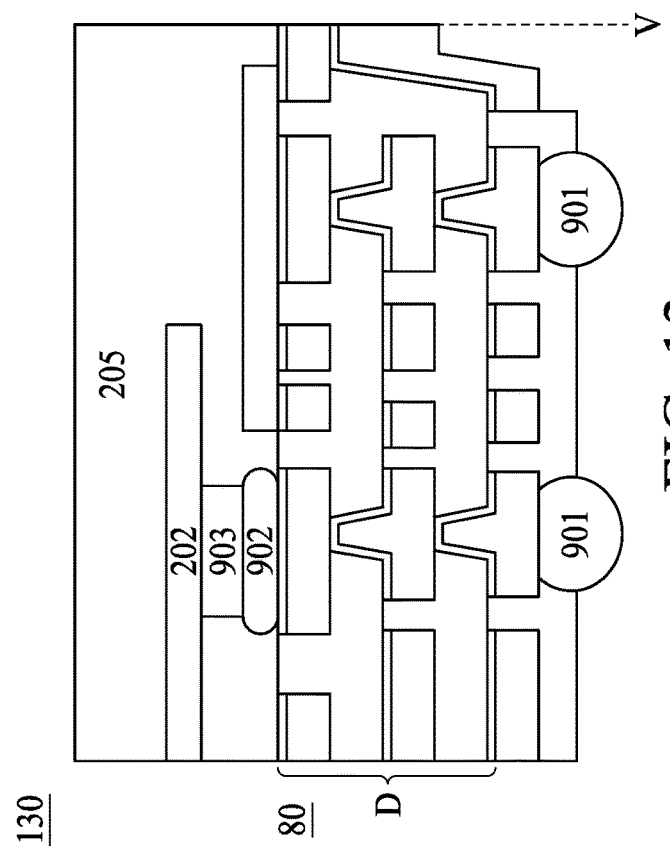
Figure 12:
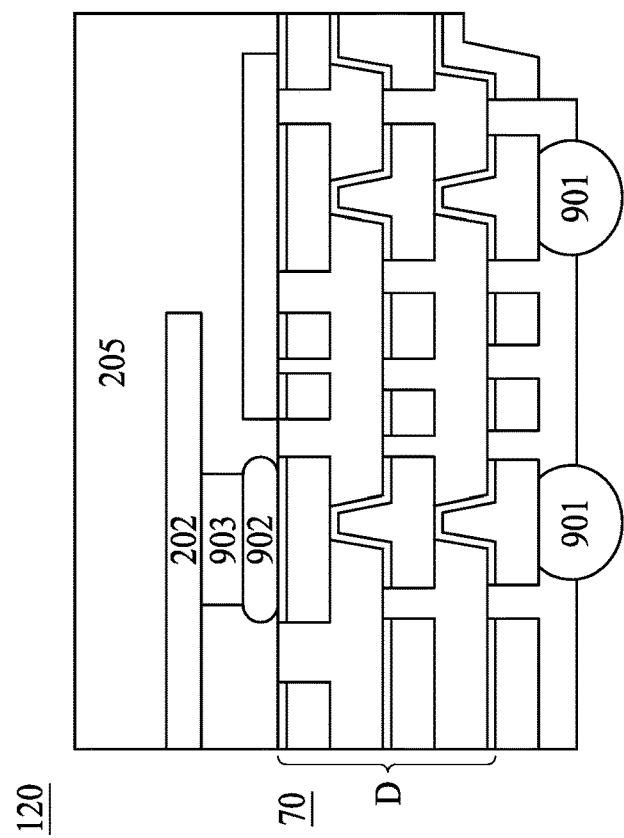

Referring to FIG. 8, FIG. 8 illustrates a semiconductor substrate 80 similar to that of the semiconductor substrate 40, except for the portion of the first metal structure M1 and the second metal structure M2. In FIG. 8, no first metal structure M1 is presented at the level of the first dielectric layer D1 and the third patterned conductive layer L2. The second metal structure M2 delineates the side surface of the first dielectric layer D1 and the second dielectric layer D2 down to the level of the first patterned conductive layer L1'. In an alternative embodiment not shown in FIG. 8, the second metal structure M2 fills the scribe line region 111 to an extent that a vertical sidewall V can be observed after die separation. The vertical sidewall V is a cutting edge of the second metal structure M2 in such alternative embodiment.

FIG. 9 to FIG. 13 are cross-sectional views illustrating various semiconductor packages, according to some embodiments of the present disclosure. FIG. 9 to FIG. 13 show semiconductor packages 90, 100, 110, 120 and 130 fabricated on respective semiconductor substrates 40, 50, 60, 70 and 80, as described in FIG. 4 to FIG. 8. Details of the respective semiconductor substrates 40, 50, 60, 70 and 80 are provided in FIG. 4 to FIG. 8 of the present disclosure and are therefore omitted herein for brevity. In addition to the semiconductor substrates 40, 50, 60, 70 and 80, each of the semiconductor packages 90, 100, 110, 120 and 130 includes a top surface T and a bottom surface B of the dielectric structure D. The bottom surface B is proximal to a solder bump 901, and the top surface T is opposite to the bottom surface B and closer to the semiconductor die 202 than the bottom surface B. The semiconductor die 202 is joined with the respective semiconductor substrates 40, 50, 60, 70 and 80 through a solder bump 902 and a bond pad 903 on the semiconductor die 202. A molding compound 205 encapsulates at least the semiconductor die 202 and the bond pad 903, and the molding compound 205 is positioned on the top surface T of the dielectric structure D and is in contact with the first patterned conductive layer L1.

FIG. 9 to FIG. 13 provide one example of the various semiconductor packages including respective semiconductor substrates 40, 50, 60, 70 and 80. Other package structures, such as those described with respect to FIG. 2A, FIG. 2B, and FIG. 2C can also include respective semiconductor substrates 40, 50, 60, 70 and 80 and are within the contemplated scope of the present disclosure.

Figure 14A:
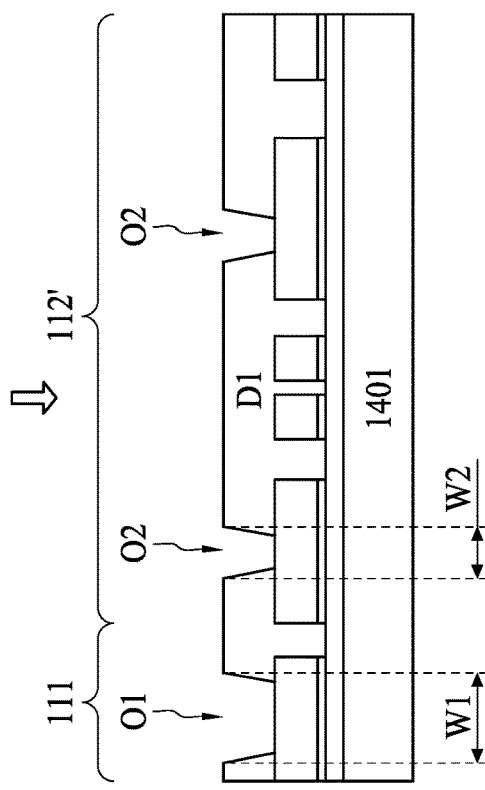

FIG. 14A to FIG. 14F are cross-sectional views illustrating the semiconductor substrate 10 in various manufacturing stages, according to some embodiments of the present disclosure. In FIG. 14A, a carrier 1401 is provided with a first patterned conductive layer L1. The first patterned conductive layer L1 can be formed by additive manufacturing or subtractive manufacturing. In additive manufacturing, a photoresist (PR) layer is formed prior to electroplating of the conductive materials. The conductive pattern is formed after the removal of the PR. On the other hand, the subtractive manufacturing performs a blanket electroplating of the conductive materials prior to PR formation. Portions of the conductive materials not covered by the PR will then be removed.

Figure 14B:
Figure 14C:
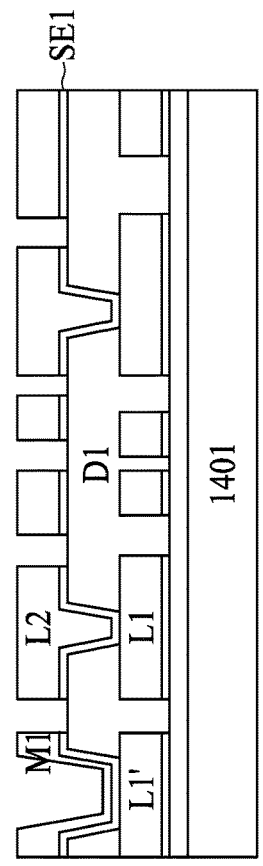

In FIG. 14B, a dielectric layer D1 is laminated over the first patterned conductive layer L1. In FIG. 14C, several openings O1 and O2 are formed in the dielectric layer D1 by laser grooving, and the openings O1 and O2 taper from the top toward the bottom of the dielectric layer D1, exposing a top surface of the first patterned conductive layer L1. In some embodiments, at least one opening O1 is formed in the scribe line region 111 and one opening O2 is formed in the conductive pattern region 112'. The opening O1 at the scribe line region 111 can be a localized via or a cross section of a saw street extending between a plurality of units 101. A width W2 of the opening O2 in the conductive pattern region 112' is from about 50 to 70 μm, and a width W1 of the opening O1 in the scribe line region 111 is from about 250 to 300 μm.

Figure 14D:
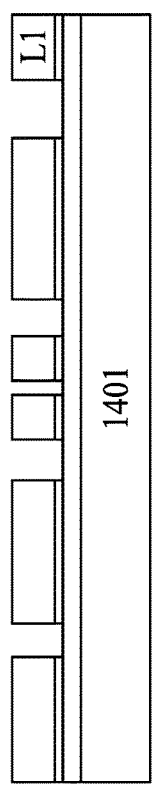

In FIG. 14D, a second patterned conductive layer SE1, such as a seed layer, is formed by an electroless plating operation to cover the top surface of the dielectric layer D1, the side walls of the openings O1 and O2, and a portion of the first patterned conductive layer L1, L1', unselectively. A third patterned conductive layer L2 is formed over the second patterned conductive layer SE1 by an additive manufacturing operation, both in the scribe line region 111 and in the conductive pattern region 112'. After removing the PR in the additive manufacturing operation, a desired pattern is obtained in the third patterned conductive layer L2. The portion of the conductive layer residing in the scribe line region 111 is a metal structure M1, and the portion residing in the conductive pattern region 112' is referred to herein as the third patterned conductive layer L2. Due to the fact that the width W1 is greater than the width W2, when conducted under one electroplating operation with identical electroplating conditions, the opening O2 is completely filled while the opening O1 is partially filled. In some embodiments, the electroplating operation conducted in FIG. 14D is a pattern plating operation, which is configured to form finer conductive lines delineating a contour of the opening O1 in the scribe line region 111, in contrast to a panel plating operation, which will be described in relation to FIG. 16D of the present disclosure.

A flash etching is conducted to further remove the remaining second patterned conductive layer SE1, which was originally under PR coverage, thereby exposing a portion of the top surface of the dielectric layer D1 through the second patterned conductive layer SE1 and the third patterned conductive layer L2. In FIG. 14E, a solder resist SR is formed over the third patterned conductive layer L2, but the solder resist SR is free from covering the scribe line region 111. After die bonding and molding operations (not shown), individual units are separated at the scribe line region 111. A semiconductor substrate 10 having a unique metal structure M1 at the scribe line region 111 after separation is illustrated in FIG. 14F. The metal structure M1 in the semiconductor substrate 10 enhances heat dissipation through extra copper density without additional manufacturing operations, while, at the same time, the unfilled scribe line trench may further alleviate substrate warpage problems.

Figure 15A:
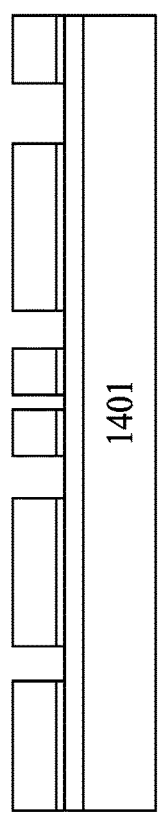
Figure 15C:
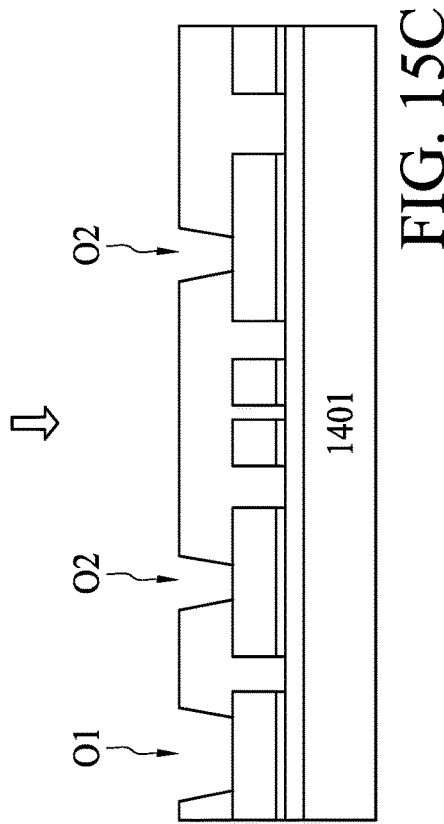
Figure 15B:
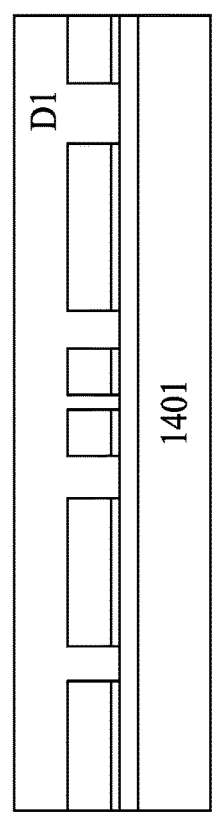
Figure 15D:
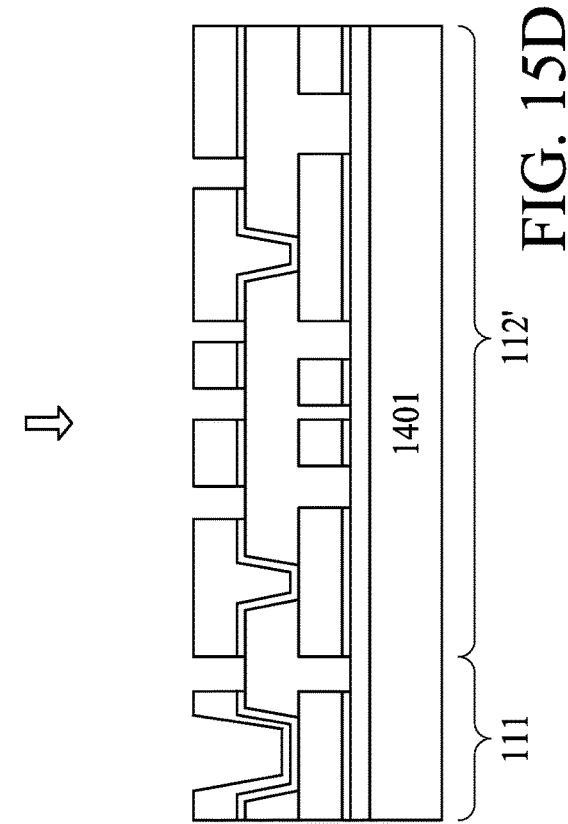

FIG. 15A to FIG. 15J are cross-sectional views illustrating the semiconductor substrate 40 in various manufacturing stages, according to some embodiments of the present disclosure. Descriptions of FIG. 15A to FIG. 15D can be found by referring to those provided for FIG. 14A to FIG. 14D and are not repeated here for brevity. In FIG. 15E, a second dielectric layer D2 is laminated over the third patterned conductive layer L2 and fills the partially filled scribe line trench delineated with the first metal structure M1. In FIG. 15F, several openings O3 and O4 are formed in the dielectric layer D2 by laser grooving, and the openings O3 and O4 taper from the top toward the bottom of the dielectric layer D2, exposing a top surface of the second patterned conductive layer L2. In some embodiments, at least one opening O3 is formed in the scribe line region 111 and one opening O2 is formed in the conductive pattern region 112'. In some embodiments, the opening O3 aligns with the first opening O1. The opening O1 at the scribe line region 111 can be a localized via or a cross section of a saw street extending between plurality of units 101. A width W3 of the opening O3 in the conductive pattern region 112' is between about 50 and 70 μm, and a width W4 of the opening O4 in the scribe line region 111 is between about 250 and 300 μm.

In FIG. 15G, a fourth patterned conductive layer SE2, such as a seed layer, is formed by an electroless plating operation to cover the top surface of the dielectric layer D2, the side walls of the openings O3 and O4, and a portion of the first metal structure M1, unselectively. A fifth patterned conductive layer L3 is formed over the fourth patterned conductive layer SE2 by an additive manufacturing operation, both in the scribe line region 111 and in the conductive pattern region 112'. After removing the PR in the additive manufacturing operation, a desired pattern is obtained in the fifth patterned conductive layer L2. The portion of the conductive layer residing in the scribe line region 111 is a metal structure M2, and the portion residing in the conductive pattern region 112' is referred to herein as the fifth patterned conductive layer L3. Due to the fact that the width W3 is greater than the width W4, when conducted under one electroplating operation with identical electroplating conditions, the opening O4 is completely filled while the opening O3 is partially filled. In some embodiments, the electroplating operation conducted in FIG. 15G is a pattern plating operation. A flash etching is conducted to further remove the remaining fourth patterned conductive layer SE2, which was originally under PR coverage, thereby exposing a portion of the top surface of the dielectric layer D2 through the fourth patterned conductive layer SE2 and the fifth patterned conductive layer L3.

Figure 15I:
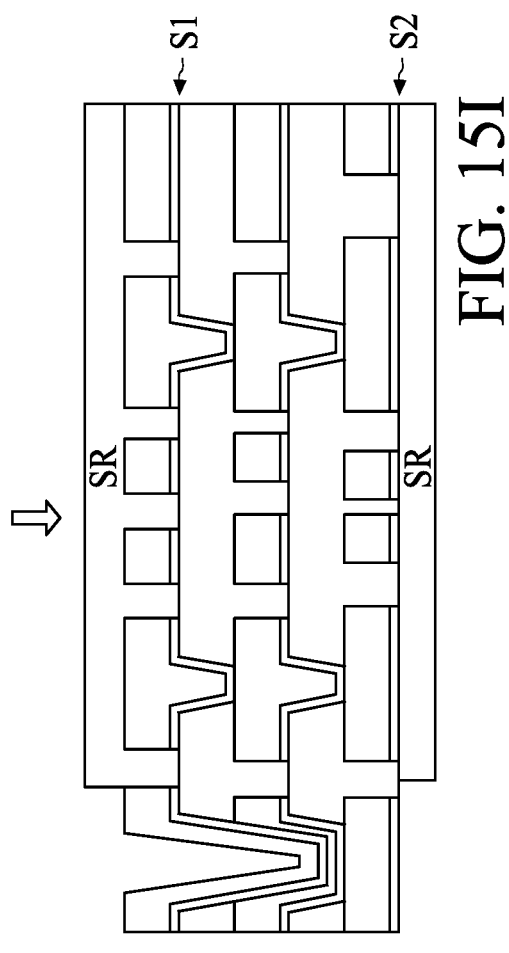
Figure 15J:
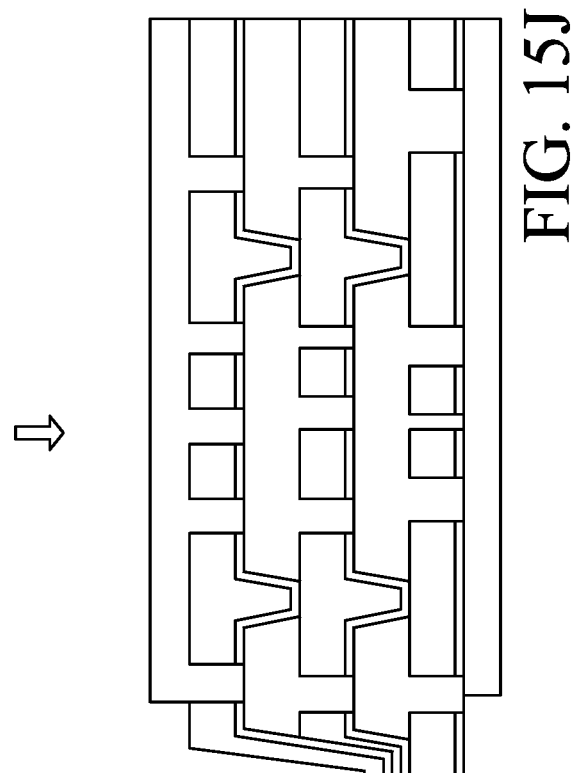

In FIG. 15H to FIG. 15I, the carrier 1401 is removed from a second side S2 of the dielectric layers D1 and D2. Solder resist SR is subsequently formed on the first side S1 and the second side S2 of the dielectric layers D1 and D2, but the solder resist SR is free from covering the scribe line region 111. After die bonding and molding operations (not shown), individual units are separated at the scribe line region 111. A semiconductor substrate 40 having unique metal structures M1 and M2 at the scribe line region 111 after separation is illustrated in FIG. 15J. The metal structures M1 and M2 in the semiconductor substrate 40 enhance heat dissipation through extra copper density without additional manufacturing operations, while, at the same time, the unfilled scribe line trench may further alleviate substrate warpage problems.

Figure 16K:
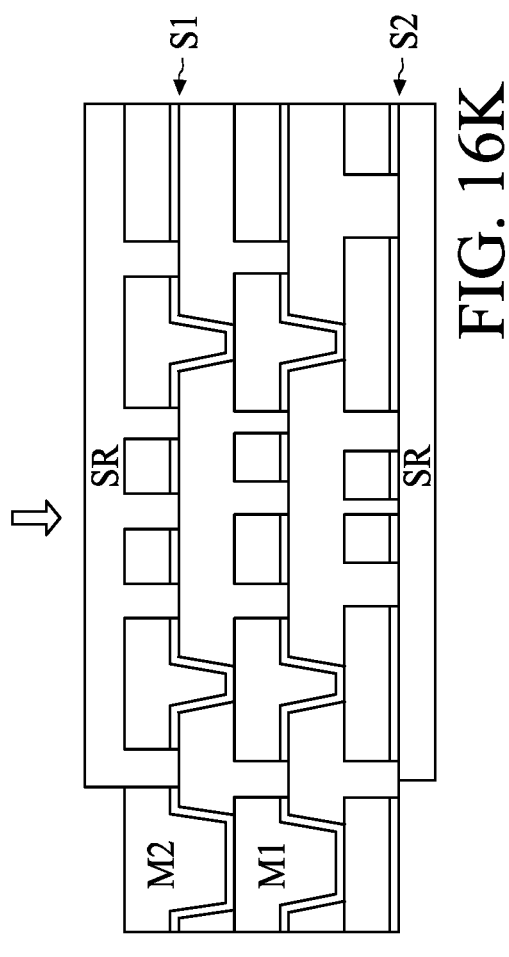

FIG. 16A to FIG. 16L are cross-sectional views illustrating the semiconductor substrate 50 in various manufacturing stages, according to some embodiments of the present disclosure. Description of FIG. 16A to FIG. 16C can be found by referring to those provided for FIG. 14A to FIG. 14C and are not repeated here for brevity. In FIG. 16D, a second patterned conductive layer SE1, such as a seed layer, is formed by an electroless plating operation to cover the top surface of the dielectric layer D1, the side walls of the openings O1 and O2, and a portion of the first patterned conductive layers L1 and L1', unselectively. A third patterned conductive layer L2' is panel plated over the second patterned conductive layer SE1, both in the scribe line region 111 and in the conductive pattern region 112'. In contrast to the pattern plating operation, the panel plating operation conducted in FIG. 16D forms coarser conductive lines, completely filling the opening O1 in the scribe line region 111 and the opening O2 in the conductive pattern region 112'. In some embodiments, the electroplating operation of FIG. 16D can be conducted by a pattern plating followed by a panel plating.

Comparing the pattern plating in FIG. 14D to the panel plating in FIG. 16D, panel plating allows the semiconductor substrate to possess a greater volume of conductive material, for example, greater volume of copper, thereby enhancing mechanical strength or rigidity of the semiconductor substrate. By adopting both panel plating and pattern plating in a suitable fashion, one can control the conductive material volume in the opening O1, thereby achieving desirable mechanical strength or rigidity of the semiconductor substrate in order to protect against foreseeable warpage problems.

In FIG. 16E, a reduction operation is conducted to remove excess conductive material from above the top surface of the dielectric layer D1. In FIG. 16F, the third patterned conductive layer L2 is completed by, for example, a subtractive manufacturing process. Following FIG. 16E, a conductive layer is plated over the top surface of the dielectric layer D1, followed by a patterned PR formation. As shown in FIG. 16F, the portion of the conductive layer exposed through the patterned PR is removed, rendering the third patterned conductive layer L2 in the conductive pattern region 112' and the first metal structure M1 in the scribe line region 111. In FIG. 16G, a second dielectric layer D2 is laminated over the third patterned conductive layer L2 and covers the first metal structure M1. In FIG. 16H, several openings O3 and O4 are formed in the dielectric layer D2 by laser grooving, and the openings O3 and O4 taper from the top toward the bottom of the dielectric layer D2, exposing a top surface of the second patterned conductive layer L2 and the first metal structure M1. In some embodiments, at least one opening O3 is formed in the scribe line region 111 and one opening O4 is formed in the conductive pattern region 112'. In some embodiments, the opening O3 aligns with the first opening O1. The opening O1 at the scribe line region 111 can be a localized via or a cross section of a saw street extending between a plurality of units 101. A width W4 of the opening O4 in the conductive pattern region 112' is between about 50 and 70 μm, and a width W3 of the opening O3 in the scribe line region 111 is between about 250 and 300 μm.

In FIG. 16I, a fourth patterned conductive layer SE2, such as a seed layer, is formed by an electroless plating operation to cover the top surface of the dielectric layer D2, the side walls of the openings O3 and O4, and a portion of the first metal structure M1, unselectively. A fifth patterned conductive layer L3 and the second metal structure M2 are formed over the fourth patterned conductive layer SE2, in the conductive pattern region 112' and in the scribe line region 111, respectively. In some embodiments, formation of the fifth patterned conductive layer L3 and the second metal structure M2 may follow the description of the formation of the third patterned conductive layer L2 and the first metal structure M1 in the current embodiment, and the description thereof is not repeated here for brevity.

Figure 16L:
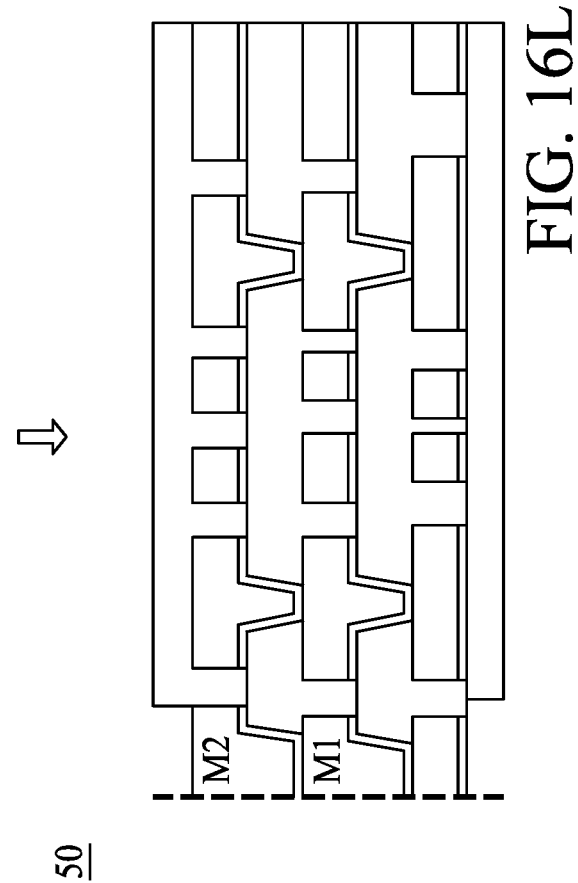

In FIG. 16J to FIG. 16K, the carrier 1401 is removed from a second side S2 of the dielectric layers D1 and D2. A solder resist SR is subsequently formed on the first side S1 and the second side S2 of the dielectric layers D1 and D2, but the solder resist SR is free from covering the scribe line region 111. After die bonding and molding operations (not shown), individual units are separated at the scribe line region 111. A semiconductor substrate 50 having unique metal structures M1 and M2 at the scribe line region 111 after separation is illustrated in FIG. 16L. The metal structures M1 and M2 in the semiconductor substrate 50 enhance heat dissipation through extra copper density without additional manufacturing operations. Although the scribe line trench is filled with conductive materials, substrate warpage problems can be better alleviated compared to the configuration where just the dielectric layers D1 and D2 reside in the scribe line region 111.

Figure 17A:
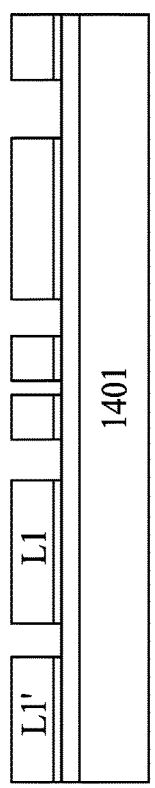
Figure 17B:
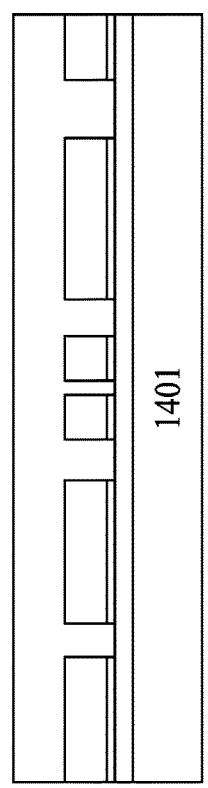
Figure 17C:
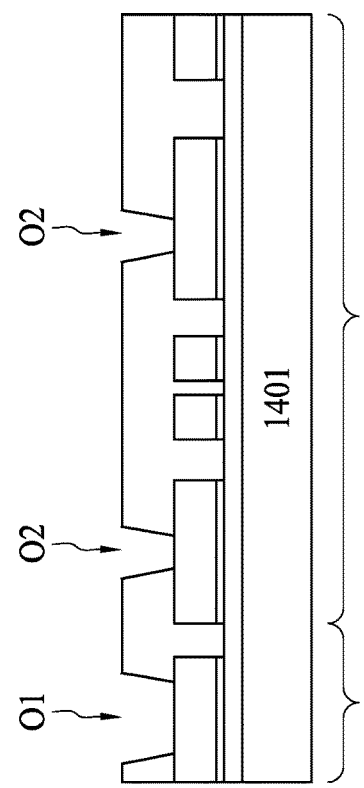
Figure 17D:
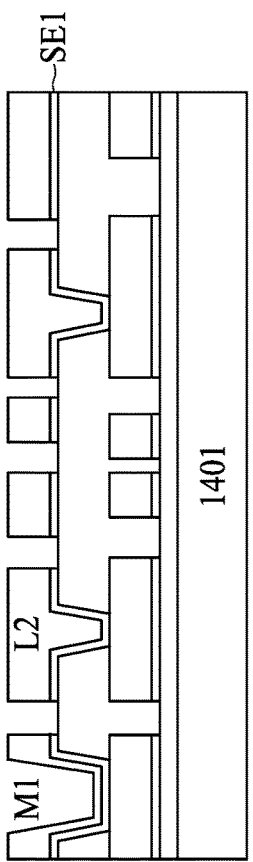
Figure 17E:
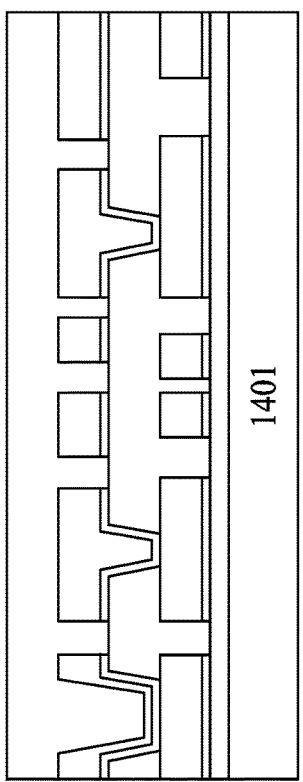
Figure 17F:
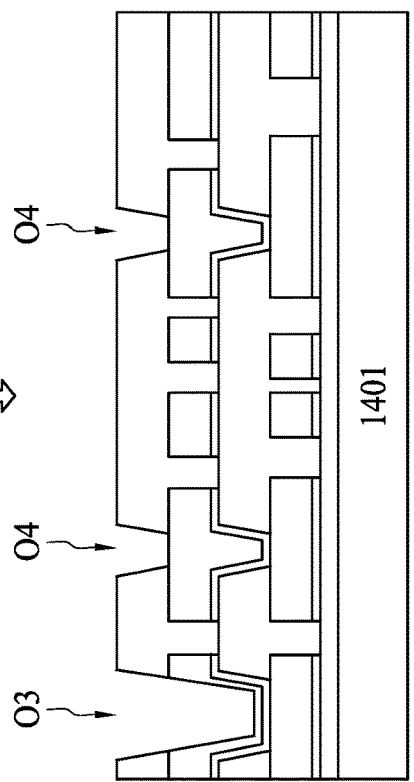

FIG. 17A to FIG. 17L are cross-sectional views illustrating the semiconductor substrate 60 in various manufacturing stages, according to some embodiments of the present disclosure. Descriptions of FIG. 17A to FIG. 17F can be found by referring to descriptions of FIG. 15A to FIG. 15F and are not repeated here for brevity. In FIG. 17G, a fourth patterned conductive layer SE2, such as a seed layer, is formed by an electroless plating operation to cover the top surface of the dielectric layer D2, the side walls of the openings O3 and O4, and portions of the third patterned conductive layer L2 and the first metal structure M1, unselectively. A fifth patterned conductive layer L3' is panel plated over the fourth patterned conductive layer SE2, both in the scribe line region 111 and in the conductive pattern region 112'. In contrast to the pattern plating operation, the panel plating operation conducted in FIG. 17G forms coarser conductive lines, completely filling the opening O3 in the scribe line region 111 and the opening O4 in the conductive pattern region 112'. In some embodiments, the electroplating operation of FIG. 17G can be conducted by a pattern plating followed by a panel plating.

In FIG. 17H, a reduction operation is conducted to remove excess conductive material from above the top surface of the dielectric layer D2. In FIG. 17I, the fifth patterned conductive layer L3 is completed by, for example, a subtractive manufacturing process. Following FIG. 17H, a conductive layer is plated over the top surface of the dielectric layer D2, followed by a patterned PR formation. As shown in FIG. 17I, the portion of the conductive layer exposed through the patterned PR is removed, rendering the fifth patterned conductive layer L3 in the conductive pattern region 112' and the second metal structure M2 in the scribe line region 111. Due to the panel plating conducted in FIG. 17G, the third opening is completely filled with conductive materials, such as copper. As previously discussed, the mechanical strength or rigidity of the semiconductor substrate can thus be further enhanced to protect against the warpage effect.

Figure 17K:
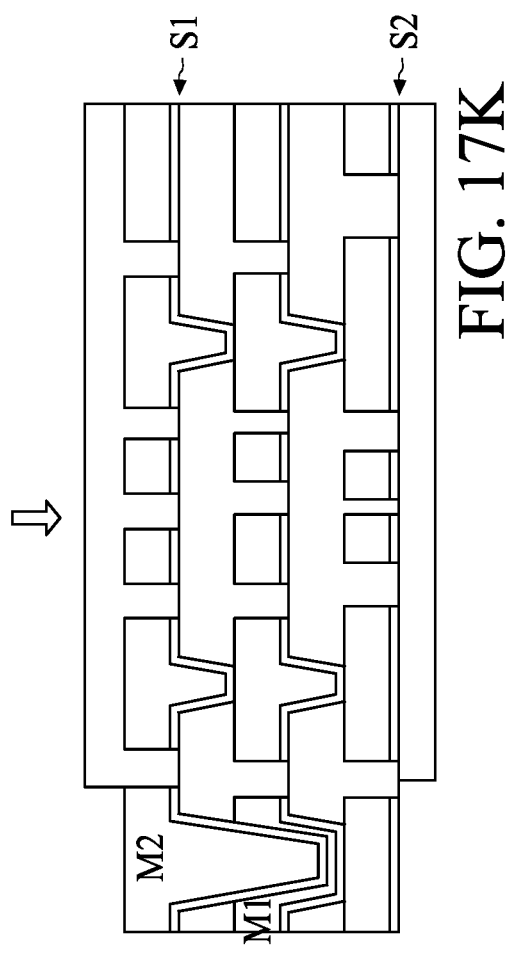
Figure 17L:
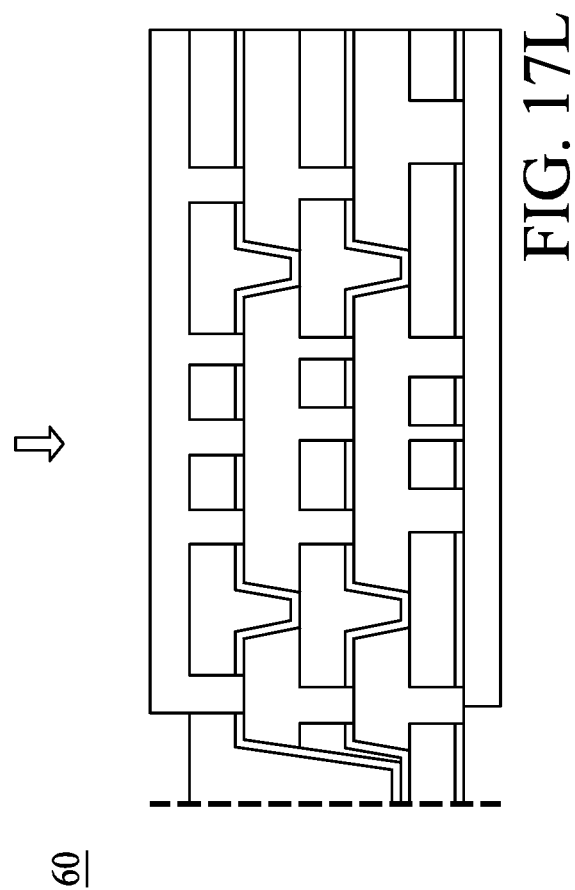

In FIG. 17J to FIG. 17K, the carrier 1401 is removed from a second side S2 of the dielectric layers D1 and D2. A solder resist SR is subsequently formed on the first side S1 and the second side S2 of the dielectric layers D1 and D2, but the solder resist SR is free from covering the scribe line region 111. After die bonding and molding operations (not shown), individual units are separated at the scribe line region 111. A semiconductor substrate 60 having unique metal structures M1 and M2 at the scribe line region 111 after separation is illustrated in FIG. 17L. The metal structures M1 and M2 in the semiconductor substrate 60 enhance heat dissipation through extra copper density without additional manufacturing operations. Although the scribe line trench is filled with conductive materials, the substrate warpage problem can be better alleviated compared to the configuration where just the dielectric layers D1 and D2 reside in the scribe line region 111.

Figure 18A:
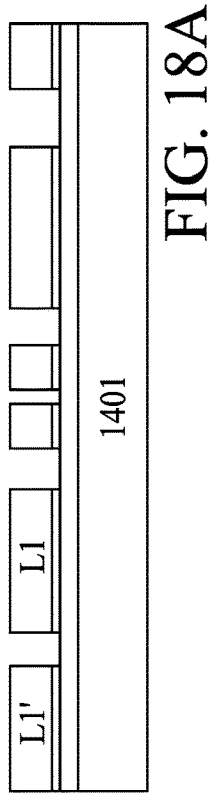
FIG. 18A, FIG. 18B, FIG. 18C, FIG. 18D, FIG. 18E, FIG. 18F, FIG. 18G, FIG. 18H, FIG. 18I, FIG. 18J, FIG. 18K, and FIG. 18L are cross-sectional views illustrating a semiconductor substrate in various manufacturing stages, according to some embodiments of the present disclosure.
Figure 18B:
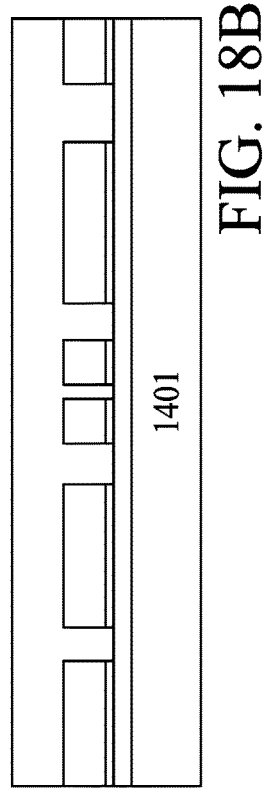
Figure 18C:
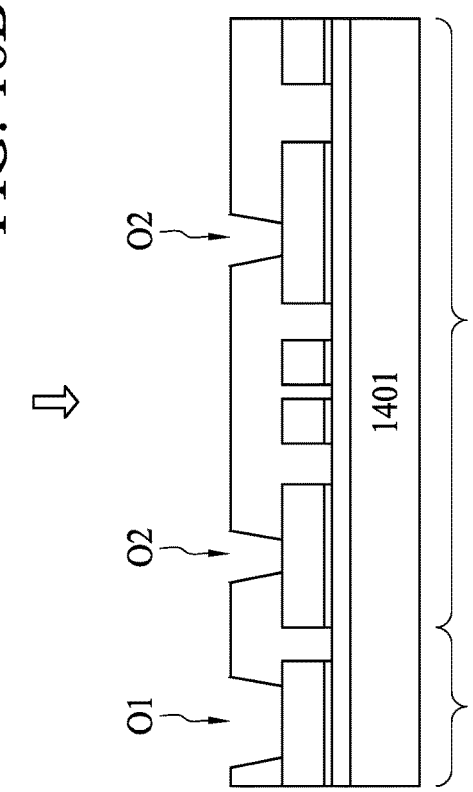
Figure 18D:
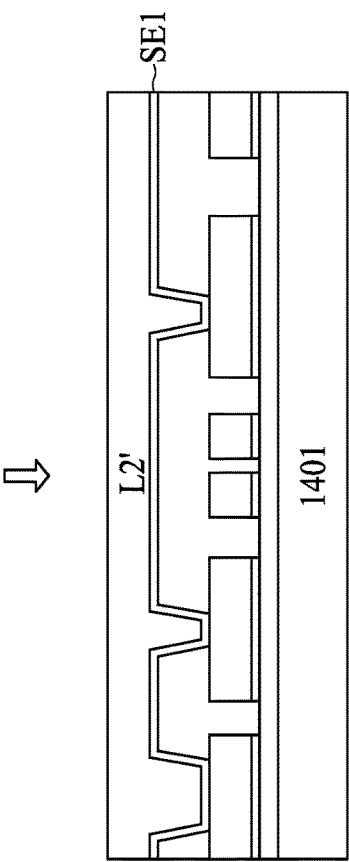
Figure 18E:
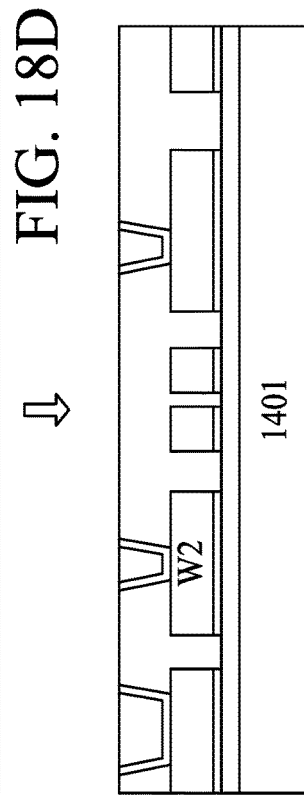
Figure 18F:
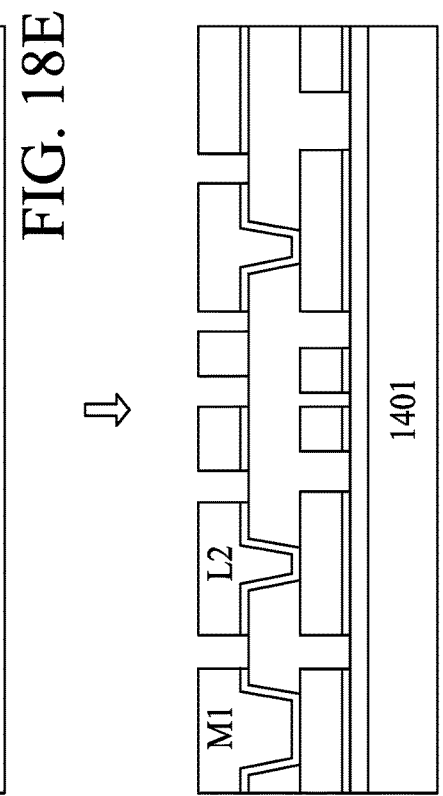
Figure 18I:
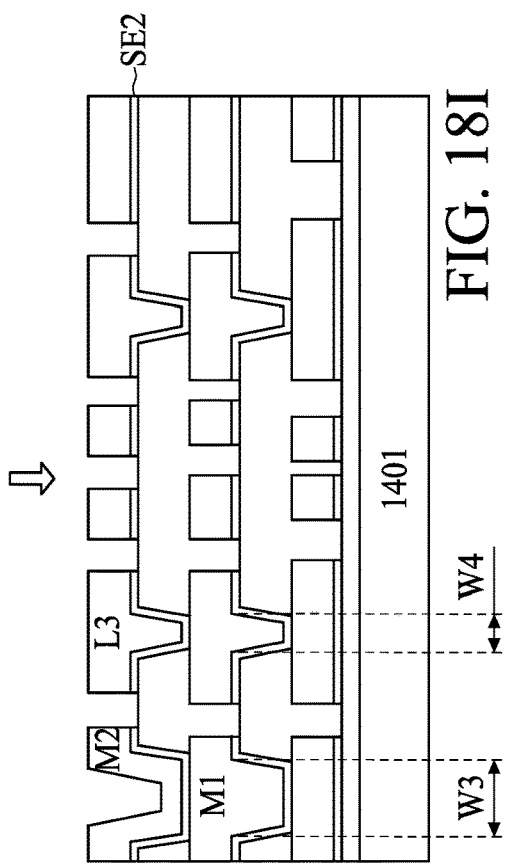

FIG. 18A to FIG. 18L are cross-sectional views illustrating the semiconductor substrate 70 in various manufacturing stages, according to some embodiments of the present disclosure. Descriptions of FIG. 18A to FIG. 18H can be found by referring to descriptions addressing FIG. 16A to FIG. 16H and are not repeated here for brevity. In FIG. 18I, a fourth patterned conductive layer SE2, such as a seed layer, is formed by an electroless plating operation to cover the top surface of the dielectric layer D2, the side walls of the openings O3 and O4, a portion of the second patterned conductive layer L2, and the first metal structure M1, unselectively. A fifth patterned conductive layer L3 is formed over the fourth patterned conductive layer SE2 by an additive manufacturing operation, both in the scribe line region 111 and in the conductive pattern region 112'. After removing the PR in the additive manufacturing operation, a desired pattern is obtained in the fifth patterned conductive layer L3. The portion of the conductive layer residing in the scribe line region 111 is a metal structure M2, and the portion residing in the conductive pattern region 112' is referred to herein as the fifth patterned conductive layer L3. Due to the fact that the width W3 is greater than the width W4, when conducted under one electroplating operation with identical electroplating conditions, the opening O4 is completely filled while the opening O3 is partially filled. In some embodiments, the electroplating operation conducted in FIG. 18I is a pattern plating operation.

Figure 18J:
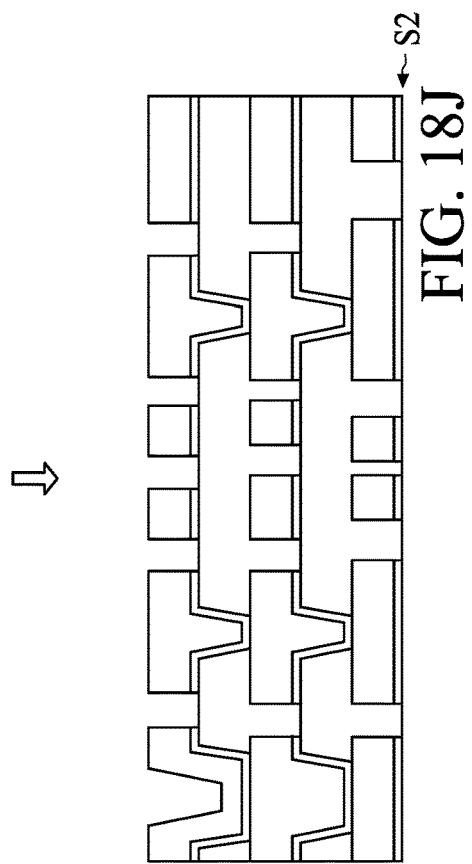
Figure 18G:
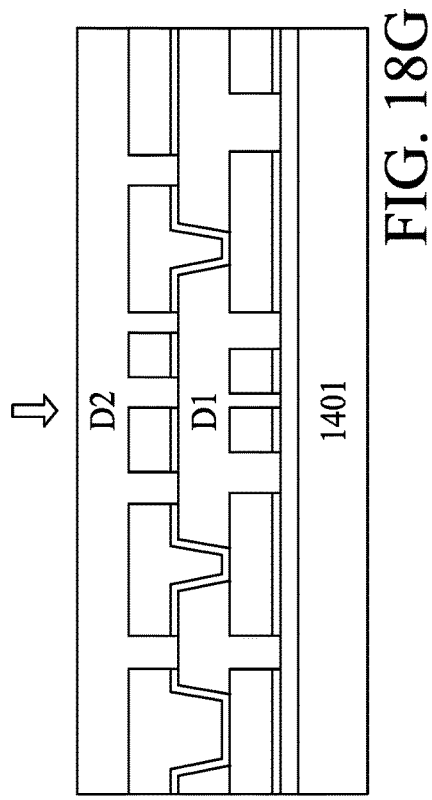
Figure 18H:
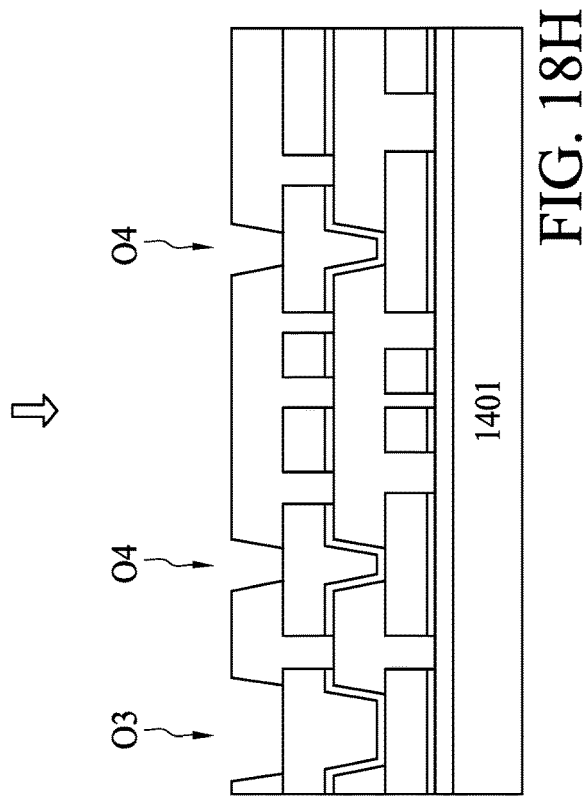
Figure 18K:
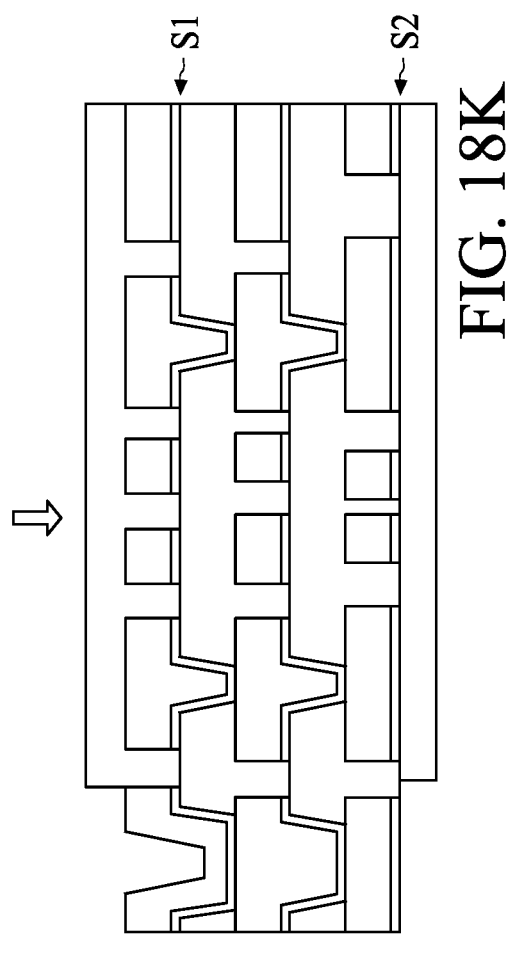
Figure 18L:
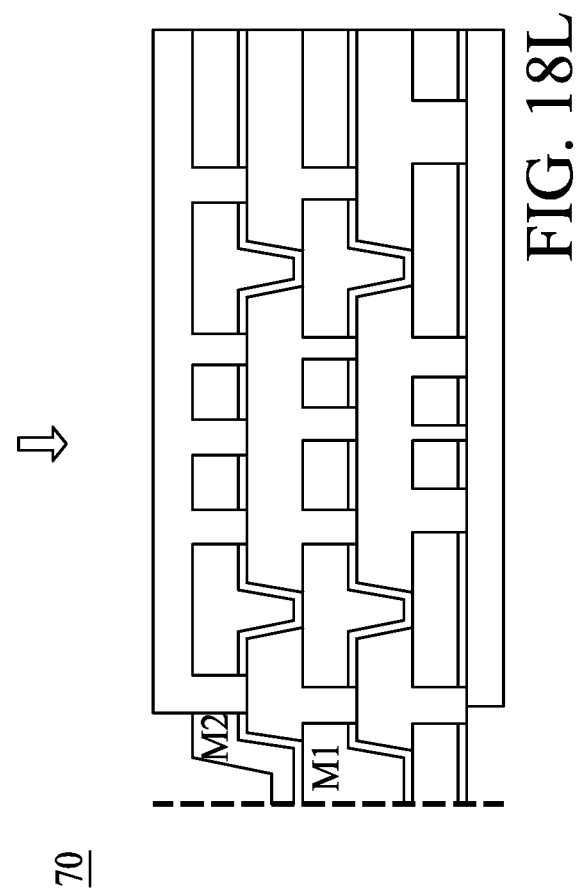

In FIG. 18J to FIG. 18K, the carrier 1401 is removed from a second side S2 of the dielectric layers D1 and D2. A solder resist SR is subsequently formed on the first side S1 and the second side S2 of the dielectric layers D1 and D2, but the solder resist is free from covering the scribe line region 111. After die bonding and molding operations (not shown), individual units are separated at the scribe line region 111. A semiconductor substrate 70 having unique metal structures M1 and M2 at the scribe line region 111 after separation is illustrated in FIG. 18L. The metal structures M1 and M2 in the semiconductor substrate 70 enhance heat dissipation through extra copper density without additional manufacturing operations, while, at the same time, the unfilled scribe line trench may further alleviate substrate warpage problems.

Figure 19I:
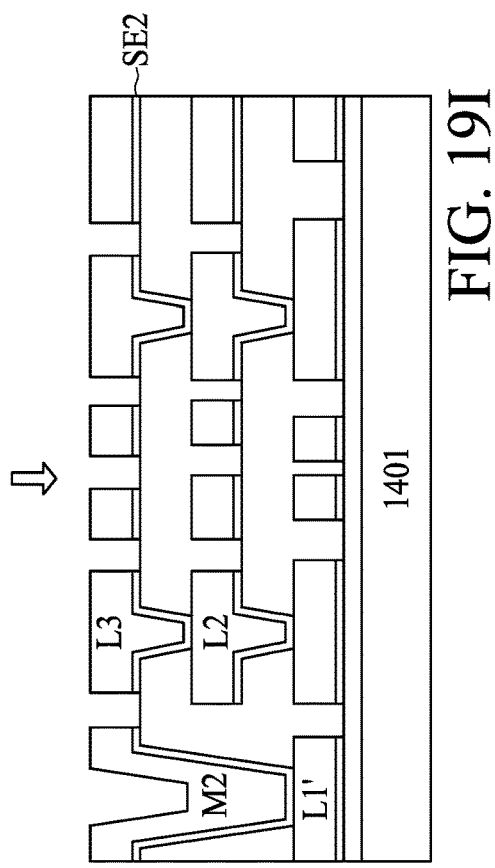
Figure 19J:
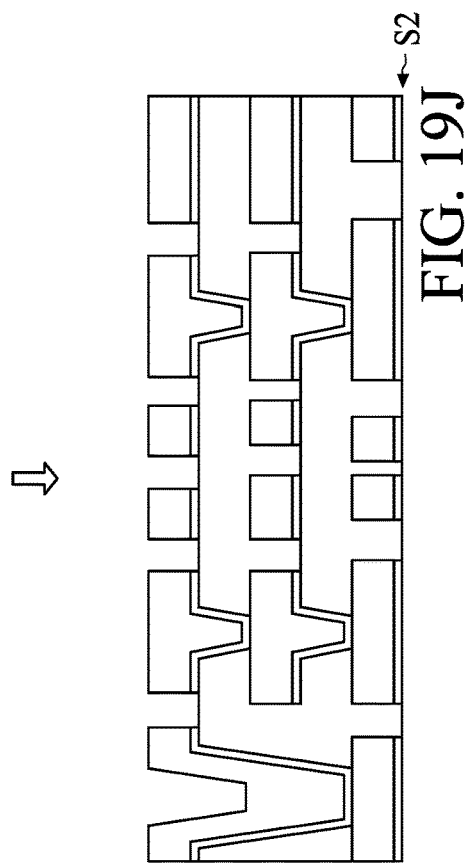
Figure 19G:
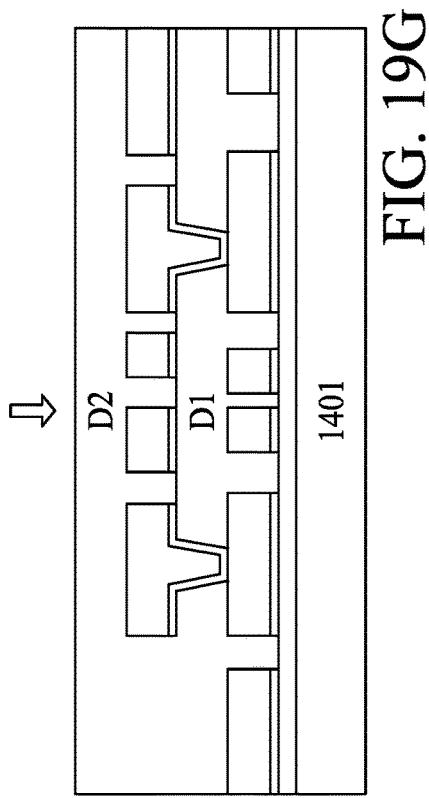
Figure 19H:
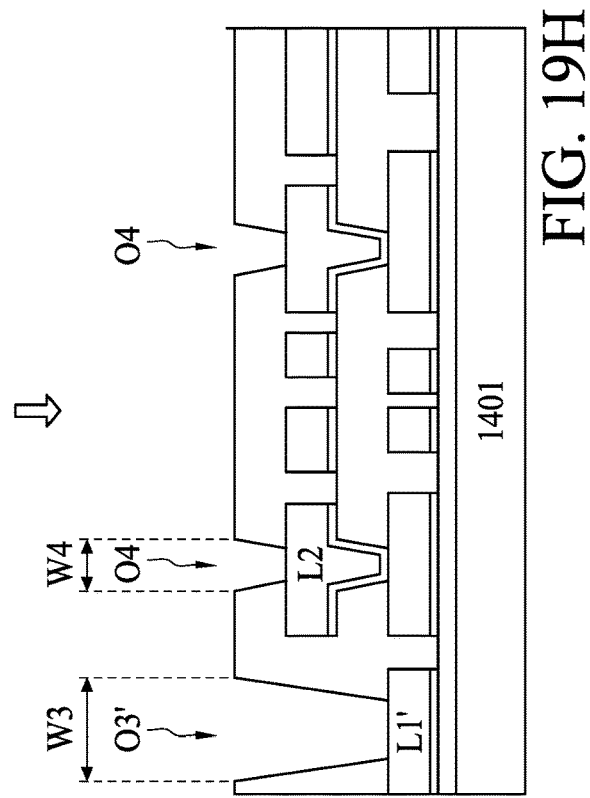

FIG. 19A to FIG. 19L are cross-sectional views illustrating the semiconductor substrate 80 in various manufacturing stages, according to some embodiments of the present disclosure. Descriptions of FIG. 19A to FIG. 19B can be found by referring to descriptions addressing FIG. 14A to FIG. 14B, and are not repeated herein for brevity. In FIG. 19C, several openings O2 are formed in the dielectric layer D1 by laser grooving, and the openings O2 taper from the top toward the bottom of the dielectric layer D1, exposing a top surface of the first patterned conductive layer L1. In some embodiments, openings O2 are selectively formed in the conductive pattern region 112' with a width W2 of from about 50 to 70 µm. Descriptions of FIG. 19D to FIG. 19G can be found by referring to descriptions addressing FIG. 18D to FIG. 18G and are not repeated herein for brevity. In FIG. 19H, several openings O3' and O4 are formed in the dielectric layer D2 by laser grooving, and the openings O3' and O4 taper from the top toward the bottom of the dielectric layer D2, exposing a top surface of the first patterned conductive layer L1' and a top surface of the second patterned conductive layer L2, respectively. In some embodiments, at least one opening O3' is formed in the scribe line region 111. In some embodiments, the opening O3' aligns with the first patterned conductive layer L1'. The opening O3' at the scribe line region 111 can be a localized via or a cross section of a saw street extending between a plurality of units 101. A width W3 of the opening O3' in the conductive pattern region 112' is between about 250 and 300 µm, and a width W4 of the opening O4 in the scribe line region 111 is between about 50 and 70 µm.

In FIG. 19I, a fourth patterned conductive layer SE2, such as a seed layer, is formed by an electroless plating operation to cover the top surface of the dielectric layer D2, the side walls of the openings O3' and O4, a portion of the second patterned conductive layer L2, and the first patterned conductive layer L1', unselectively. A fifth patterned conductive layer L3 is formed over the fourth patterned conductive layer SE2 by an additive manufacturing operation, both in the scribe line region 111 and in the conductive pattern region 112'. After removing the PR in the additive manufacturing operation, a desired pattern is obtained in the fifth patterned conductive layer L3. The portion of the conductive layer residing in the scribe line region 111 is a metal structure M2, and the portion residing in the conductive pattern region 112' is referred to herein as the fifth patterned conductive layer L3. Due to the fact that the width W3 is greater than the width W4, when conducted under one electroplating operation with identical electroplating conditions, the opening O4 is completely filled while the opening O3 is partially filled. In some embodiments, the electroplating operation conducted in FIG. 19I is a pattern plating operation.

Alternatively, in FIG. 19I, a fifth patterned conductive layer L3 can be formed over the fourth patterned conductive layer SE2 by a subtractive manufacturing operation, such as those described in FIG. 17G to FIG. 17I, wherein the opening O3' is completely filled with conductive material, enhancing the rigidity of the semiconductor substrate 80. It should be noted that, in FIG. 19I, the second metal structure M2 is in direct contact with the first patterned conductive layer L1' in the scribe lien region 111 without the presence of the first metal structure M1.

Figure 19K:
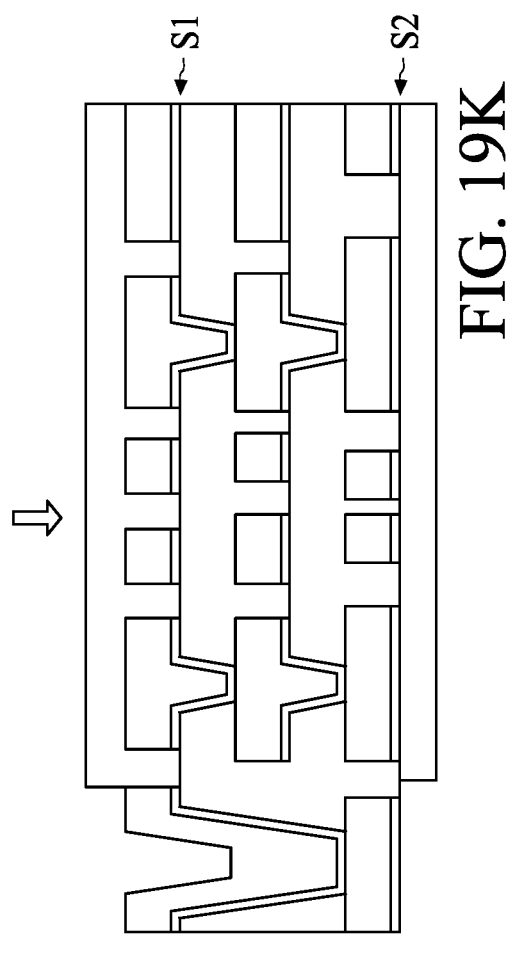
Figure 19L:
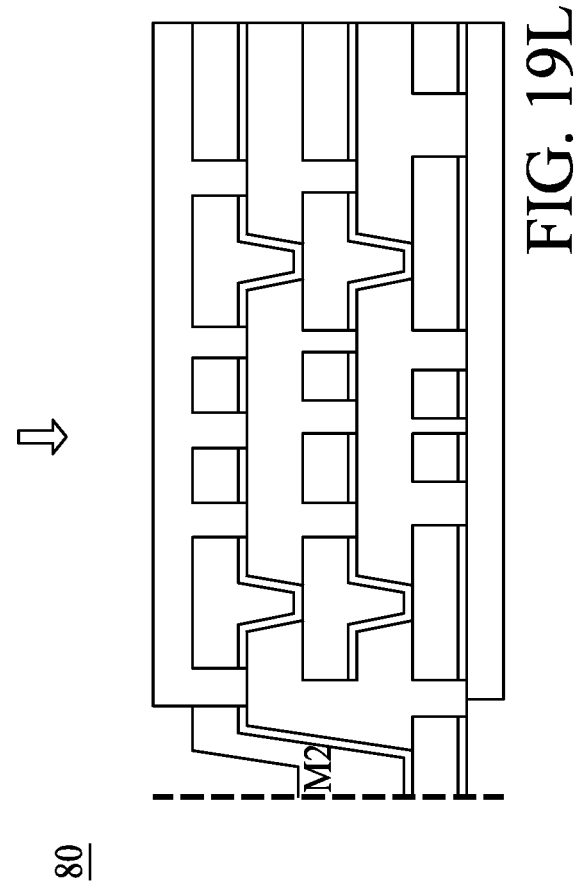

In FIG. 19J to FIG. 19K, the carrier 1401 is removed from a second side S2 of the dielectric layers D1 and D2. A solder resist SR is subsequently formed on the first side S1 and the second side S2 of the dielectric layers D1 and D2, but free from covering the scribe line region 111. After die bonding and molding operations (not shown), individual units are separated at the scribe line region 111. A semiconductor substrate 80 having unique metal structures M1 and M2 at the scribe line region 111 after separation is illustrated in FIG. 19L. The metal structures M1 and M2 in the semiconductor substrate 80 enhance heat dissipation through extra copper density without additional manufacturing operations, while, at the same time, the unfilled scribe line trench may further alleviate substrate warpage problems.

The foregoing outlines features of several embodiments and detailed aspects of the present disclosure. The embodiments described in the present disclosure may be readily used as a basis for designing or modifying other processes and structures for carrying out the same or similar purposes and/or achieving the same or similar advantages of the embodiments introduced herein. Such equivalent constructions do not depart from the spirit and scope of the present disclosure, and various changes, substitutions, and alterations may be made without departing from the spirit and scope of the present disclosure.

What is claimed is:

1. A semiconductor substrate, comprising:
   a first patterned conductive layer;
   a dielectric structure on the first patterned conductive layer, the dielectric structure having a side surface, wherein the side surface is an outermost surface and at a periphery of the dielectric structure;
   a second patterned conductive layer on the dielectric structure and extending on the side surface; and
   a third patterned conductive layer on the second patterned conductive layer and extending on the side surface.

2. The semiconductor substrate of claim 1, wherein the second patterned conductive layer is a seed layer.

3. The semiconductor substrate of claim 2, wherein a portion of the second patterned conductive layer extending on the side surface and a portion of the third patterned conductive layer extending on the side surface form a metal structure, the metal structure being a filled trench or a filled via.

4. The semiconductor substrate of claim 1, wherein the side surface is a slanted surface.

5. The semiconductor substrate of claim 3, wherein the metal structure comprises a first metal structure and a second metal structure on the first metal structure.

6. The semiconductor substrate of claim 5, wherein the dielectric structure comprises a first dielectric layer and a second dielectric layer, the first metal structure being over a top surface and the side surface of the first dielectric layer, and the second metal structure being over a top surface and the side surface of the second dielectric layer.

7. The semiconductor substrate of claim 6, wherein the second metal structure extends to a level lower than the top surface of the first dielectric layer.

8. The semiconductor device substrate of claim 3, wherein the metal structure extends through the dielectric structure and contacts the first patterned conductive layer under the side surface.

9. A semiconductor package, comprising:
   a dielectric structure having a bottom surface configured to be proximal to a solder bump and a side surface connecting to the bottom surface, wherein the side surface is an outermost surface and at a periphery of the dielectric structure;
   a first patterned conductive layer proximal to a top surface of the dielectric structure, the top surface being opposite to the bottom surface;
   a second patterned conductive layer extending on the side surface;
   a third patterned conductive layer closer to the bottom surface than the first patterned conductive layer and extending on the side surface; and
   a semiconductor die over the top surface.

10. The semiconductor package of claim 9, wherein a portion of the second patterned conductive layer extending on the side surface and a portion of the third patterned conductive layer extending on the side surface form a metal structure, and the metal structure surrounds the dielectric structure.

11. The semiconductor package of claim 9, further comprising a molding compound encapsulating the semiconductor die.

12. The semiconductor package of claim 10, wherein the metal structure is a filled trench or a filled via.

13. The semiconductor package of claim 10, wherein the metal structure is electrically coupled with a portion of the first patterned conductive layer away from the side surface.

14. The semiconductor package of claim 10, wherein the metal structure comprises a first metal structure and a second metal structure, the first metal structure being closer to the top surface than the second metal structure, and a fourth patterned conductive layer is disposed between the first metal structure and the second metal structure.

15. A method for manufacturing a semiconductor package, comprising:
providing a carrier;
forming a first patterned conductive layer on the carrier;
forming a dielectric structure on the first patterned conductive layer;
defining a scribe line region in the dielectric structure by forming an opening in the dielectric structure, wherein the first patterned conductive layer is exposed by the opening; and
concurrently forming a second patterned conductive layer on the dielectric structure and into the opening,
wherein the forming the dielectric structure comprises:
forming a first dielectric layer on the carrier;
forming a second dielectric layer on the first dielectric layer; and
after forming the dielectric structure, removing the first dielectric layer and the second dielectric layer to form the opening.

16. The method of claim 15, after forming the first dielectric layer on the carrier, further comprising:
concurrently forming a first opening in the scribe line region and a second opening in a conductive pattern region adjacent to the scribe line region; and
forming a third patterned conductive layer on the first dielectric layer, the first opening, and the second opening.

17. The method of claim 16, after forming the third patterned conductive layer, further comprising:
forming the second dielectric layer on the first dielectric layer and the first patterned conductive layer, the second dielectric layer filling into the first opening;
concurrently forming a third opening in the scribe line region and a fourth opening in the conductive pattern region, the third opening aligning with the first opening; and
forming a fourth patterned conductive layer on the second dielectric layer and into the third opening.

18. The method of claim 17, wherein forming the first patterned conductive layer and the second patterned conductive layer comprises an electrochemical plating operation.

* * * * *